United States Patent
Kim et al.

(10) Patent No.: US 12,557,519 B2
(45) Date of Patent: Feb. 17, 2026

(54) DISPLAY DEVICE

(71) Applicant: Samsung Display Co., LTD., Yongin-si (KR)

(72) Inventors: Soodong Kim, Hwaseong-si (KR); Jinwon Kim, Hwaseong-si (KR); Dahye Park, Asan-si (KR); Hye-Jin Paek, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 538 days.

(21) Appl. No.: 18/077,094

(22) Filed: Dec. 7, 2022

(65) Prior Publication Data

US 2023/0189614 A1 Jun. 15, 2023

(30) Foreign Application Priority Data

Dec. 15, 2021 (KR) .................. 10-2021-0179682

(51) Int. Cl.
*H10K 59/38* (2023.01)

(52) U.S. Cl.
CPC .................. *H10K 59/38* (2023.02)

(58) Field of Classification Search
CPC .... H10K 59/38; H10K 59/879; H10K 59/122; H10K 50/844; H10K 50/858; C08F 255/00; C08F 265/06; C08F 283/00; C08L 23/06; C08L 33/04; C08L 75/04
See application file for complete search history.

(56) References Cited

U.S. PATENT DOCUMENTS

| | | |
|---|---|---|
| 2012/0032583 A1 | 2/2012 | Kim |
| 2016/0178941 A1 | 6/2016 | Kim et al. |
| 2020/0006437 A1 | 1/2020 | Kim et al. |
| 2021/0359011 A1 | 11/2021 | Lee |
| 2022/0243084 A1 | 8/2022 | Kim et al. |
| 2022/0352268 A1* | 11/2022 | Seo ............... H10K 50/115 |
| 2023/0163262 A1* | 5/2023 | Antoniadis ........ H10H 29/8513 257/89 |

FOREIGN PATENT DOCUMENTS

| | | |
|---|---|---|
| KR | 10-2012-0012940 A | 2/2012 |
| KR | 10-2016-0077481 A | 7/2016 |
| KR | 10-2020-0003330 A | 1/2020 |
| KR | 10-2021-0064921 A | 6/2021 |
| KR | 10-2021-0142038 A | 11/2021 |
| KR | 10-2022-0112341 A | 8/2022 |

* cited by examiner

Primary Examiner — Anne M Hines
Assistant Examiner — Jose M Diaz
(74) Attorney, Agent, or Firm — Womble Bond Dickinson (US) LLP

(57) ABSTRACT

A display device includes a light emitting element substrate including a plurality of driving elements and a first light emitting element, a second light emitting element, and a third light emitting element connected to the plurality of driving elements, a first light buffer layer overlapping the first light emitting element on the light emitting element substrate, a first color conversion layer overlapping the first light buffer layer on the first light buffer layer, a second color conversion layer spaced apart from the first color conversion layer by a bank layer, and on the same layer as the first color conversion layer is on, and a third color conversion layer spaced apart from the second color conversion layer by a bank layer, and on the same layer as the first color conversion layer and the second color conversion layer are on.

20 Claims, 24 Drawing Sheets

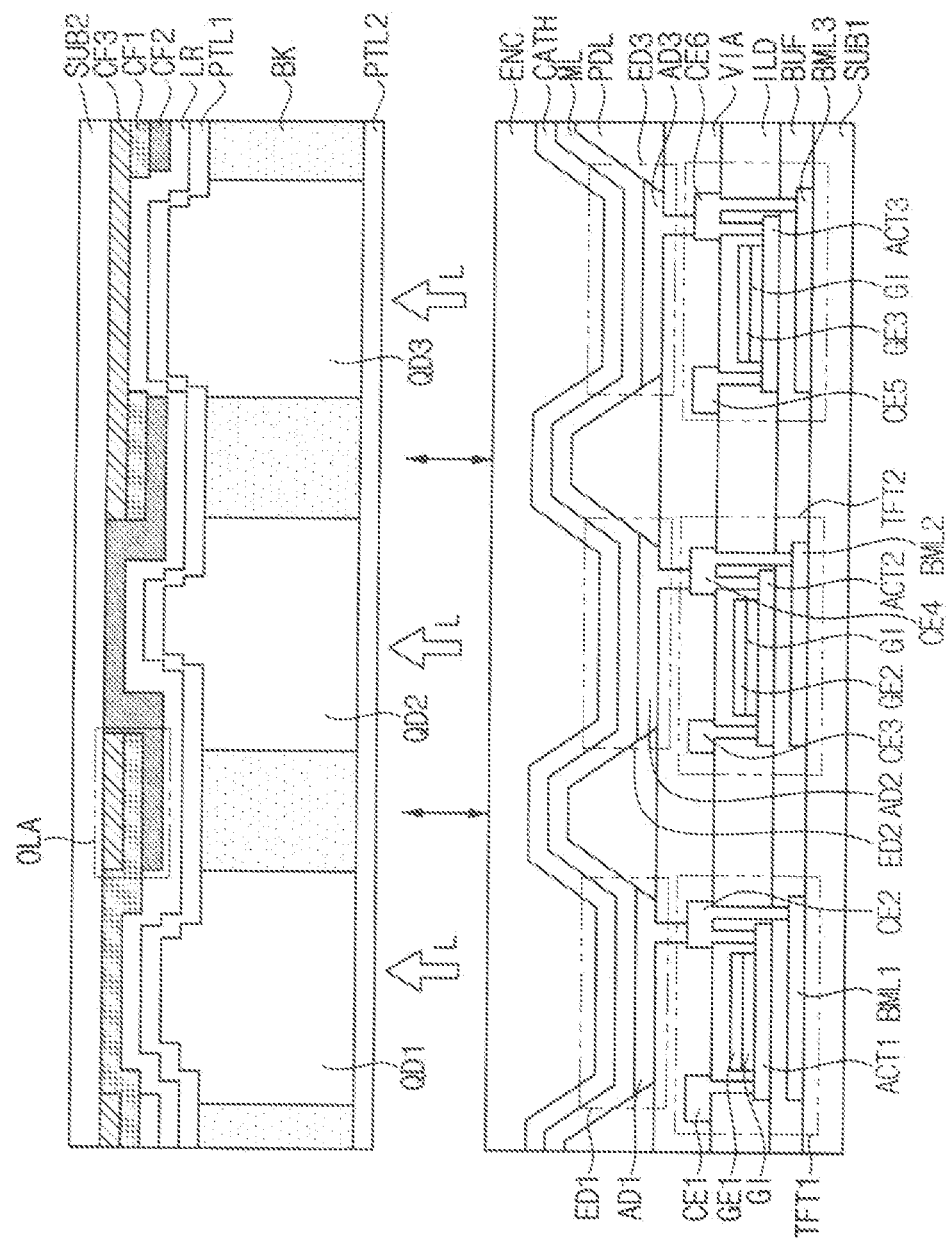

DISPLAY DEVICE

CROSS-REFERENCE TO RELATED APPLICATION(S)

This application claims priority to and the benefit of Korean Patent Application No. 10-2021-0179682, filed on Dec. 15, 2021, which is entirely hereby incorporated by reference as if fully set forth herein.

BACKGROUND

1. Field

Embodiments of the present disclosure relate to a display device.

2. Description of the Related Art

A display device may display an image to provide visual information to the user. The display device may include a liquid crystal display device, an inorganic light emitting display device, and an organic light emitting display device.

The display device may include a color conversion layer for converting a wavelength of light. Various processes may be required to form the color conversion layer. For example, in order to form the color conversion layer, after applying color conversion materials, an aging process of aging the color conversion materials using heat and light may be required.

In this case, it is preferable that light sources emitting light having an illuminance corresponding to each of the color conversion materials are applied to the process. However, it may be difficult to use different light sources corresponding to each of the color conversion materials.

SUMMARY

Aspects of embodiments of the present disclosure are directed toward a display device.

Additional aspects and/or features of the present disclosure will be set forth in the description which follows, and in part will be apparent from the description, or may be learned by practice of the present disclosure.

A display device according to an embodiment may include a light emitting element substrate including a plurality of driving elements and a first light emitting element, a second light emitting element, and a third light emitting element connected (that are connected) to the plurality of driving elements, a first light buffer layer overlapping the first light emitting element on the light emitting element substrate, a first color conversion layer overlapping the first light buffer layer, and disposed on the first light buffer layer, a second color conversion layer spaced apart from the first color conversion layer by a bank layer, and disposed on a same layer as the first color conversion layer is on, and a third color conversion layer spaced apart from the second color conversion layer by a bank layer, and disposed on the same layer the first color conversion layer and the second color conversion layer are on.

In an embodiment, the light buffer layer may further overlap the bank layer around (e.g., surrounding) the first color conversion layer.

In an embodiment, the display device may further include a column spacer overlapping the bank layer, and disposed on the same layer the first color conversion layer and the second color conversion layer are on.

In an embodiment, the display device may further include a second light buffer layer disposed between the first light buffer layer and the first color conversion layer. The second light buffer layer may overlap the first color conversion layer, the second color conversion layer, and the third color conversion layer.

In an embodiment, the display device may further include a protective layer disposed between the first light buffer layer and the light emitting element substrate.

In an embodiment, the display device may further include a protective layer disposed between the first light buffer layer and the first color conversion layer.

In an embodiment, the display device may further include a refractive layer disposed on the first color conversion layer, a first color filter, a second color filter, and a third color filter disposed on the refractive layer, and a glass substrate disposed on the first color filter, the second color filter, and the third color filter.

In an embodiment, the light buffer layer may include a solvent-free material (e.g., a solvent-free type or kind material, and the solvent free-type or kind material includes at least one selected from the group consisting of an acrylic monomer and an isocyanate.

In an embodiment, the light buffer layer may further include at least one selected from the group consisting of polyacrylate, polyurethane, polyethylene, epoxy-based compound, and ester-based compound.

In an embodiment, the light buffer layer may further include a solvent type or kind material, and the solvent type or kind material may include at least one selected from the group consisting of propylene glycol monomethyl ether acetate (PGMEA), dimethylacetamide (DMA), cyclohexylamine (CHA), gamma-butyrolactone (GBL), N-methylpyrrolidone (NMP), and dipropylene glycol methyl ether acetate (DPMA).

In an embodiment, the light buffer layer may further include at least one selected from the group consisting of thermal curing agent and a light curing agent.

In an embodiment, the light buffer layer may include a chromophore compound.

In an embodiment, the light buffer layer may include an inorganic compound.

In an embodiment, the light buffer layer may include a blue pigment particle or a yellow pigment particle.

A display device according to an embodiment may include a light emitting element substrate including a plurality of driving elements and a first light emitting element, a second light emitting element, and a third light emitting element connected (that are connected) to the plurality of driving elements, a first color conversion layer, a second color conversion layer, and a third color conversion layer overlapping the first light emitting element, the second light emitting element, and the third light emitting element on the light emitting element substrate, and a light buffer layer disposed on the second color conversion layer.

In an embodiment, the display device may further include a protective layer disposed between the light buffer layer and the first color conversion layer, the second color conversion layer, and the third color conversion layer.

In an embodiment, the display device may further include a protective layer covering the light buffer layer.

In an embodiment, the display device may further include a first protective layer disposed between the light buffer layer and the first color conversion layer, the second color conversion layer, and the third color conversion layer, and a second protective layer covering the light buffer layer.

The display device according to various embodiments may include a light buffer layer disposed on a color conversion layer.

The color conversion layer may prevent or reduce overshooting of the color conversion layer, and may improve durability of the display device.

It is to be understood that both the foregoing general description and the following detailed description are examples and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the s present disclosure.

FIG. 2A and FIG. 2B are cross-sectional views taken along a line I-I' of FIG. 1 according to an embodiment of the present disclosure.

DETAILED DESCRIPTION

Illustrative, non-limiting embodiments will be more clearly understood from the following detailed description in conjunction with the accompanying drawings.

Figure 1:
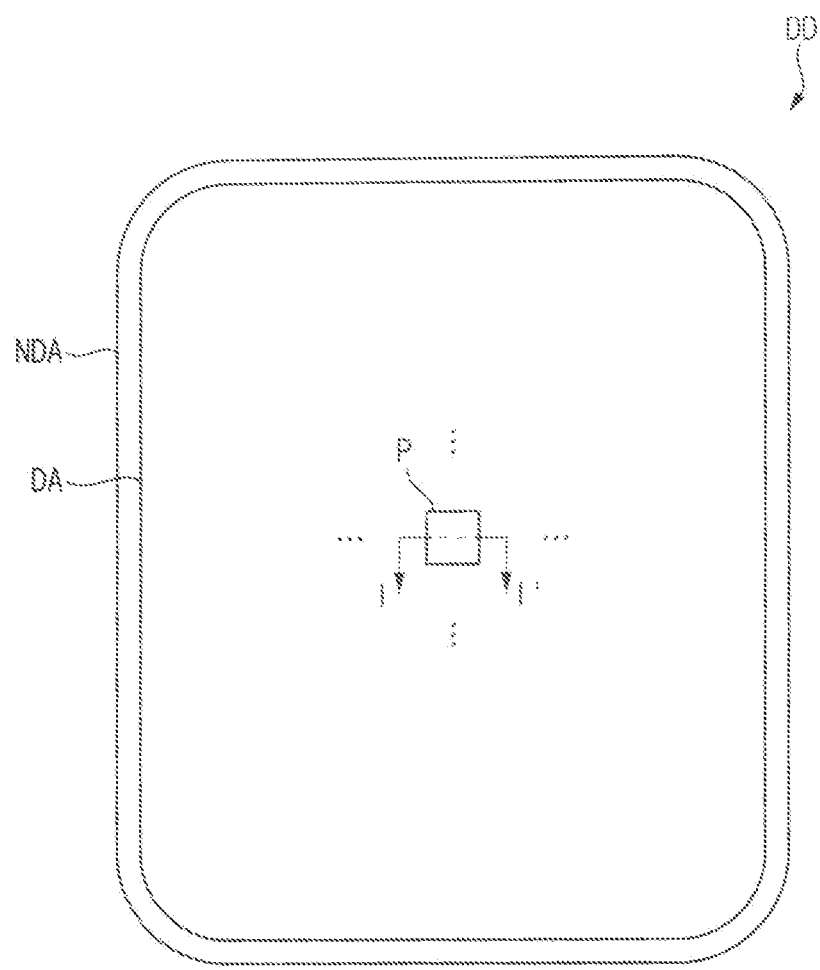
FIG. 1 is a plan view illustrating a display device according to an embodiment of the present disclosure.

FIG. 1 is a plan view illustrating a display device according to an embodiment of the present disclosure.

Referring to FIG. 1, a display device DD may include a display area DA and a non-display area NDA. The non-display area NDA may be disposed adjacent to at least one side of the display area DA. In an embodiment, the non-display area NDA may be around (e.g., all around or surround) the display area DA.

A plurality of pixels P may be disposed in the display area DA. The plurality of pixels P may include a driving element (e.g., a transistor) and a light emitting element (e.g., an organic light emitting element) electrically connected to the driving element. The light emitting element may emit light by receiving a signal from the driving element. As such, the display device DD may display an image by emitting light from the plurality of pixels P.

A driving part for driving the plurality of pixels P may be disposed in the non-display area NDA. The driving part may include a data driving part, a gate driving part, a light emitting driving part, a power voltage generator, a timing controller, etc. The plurality of pixels P may emit light based on signals received from the driving part.

Figure 2B:
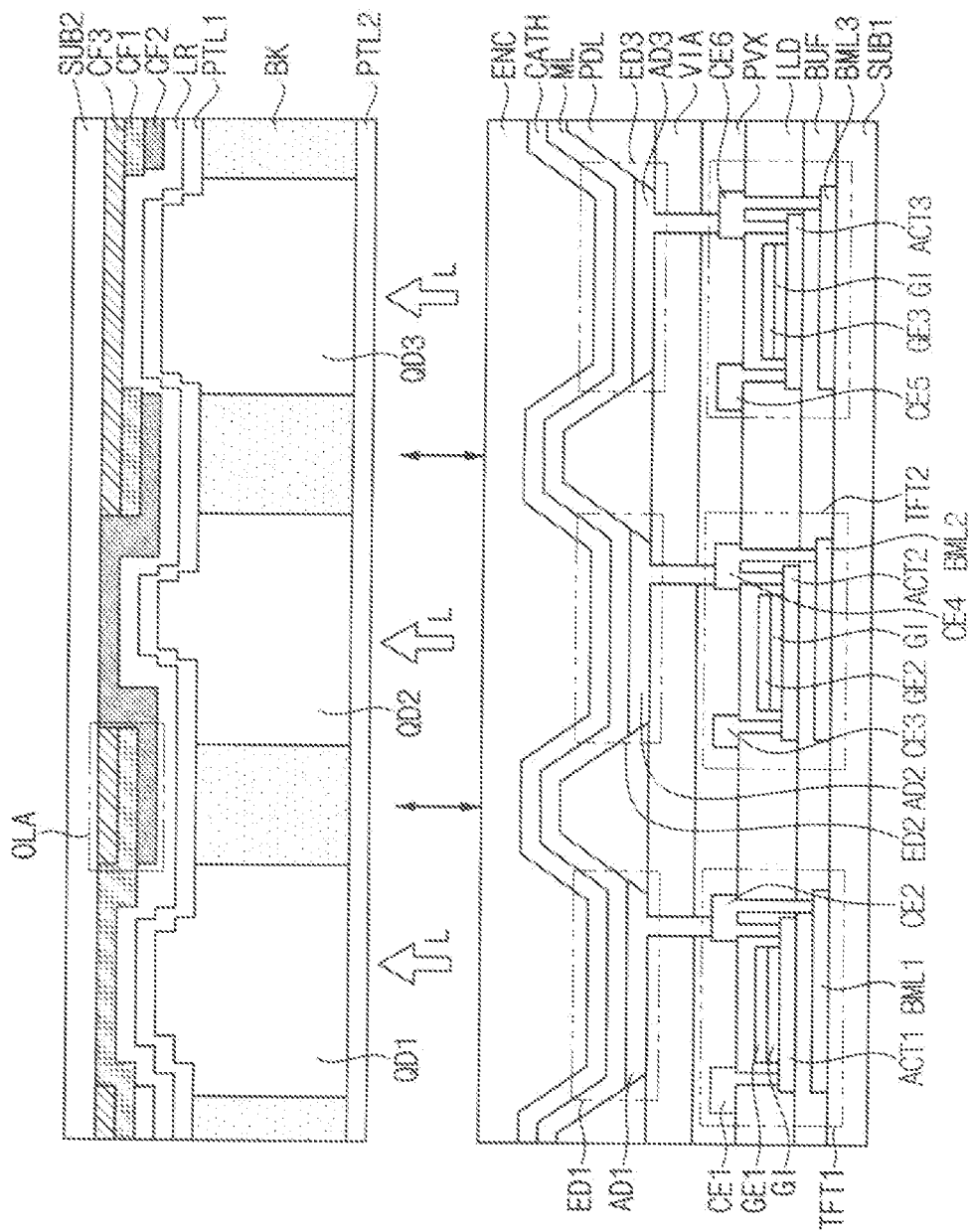

FIG. 2A and FIG. 2B are cross-sectional views taken along a line I-I' of FIG. 1 according to an embodiment of the present disclosure.

Referring to FIG. 1 and FIG. 2A, the display device DD may include a first substrate SUB1, a first lower electrode BML1, a second lower electrode BML2, a third lower electrode BML3, a buffer layer BUF, a first transistor TFT1, a second transistor TFT2, a third transistor TFT3, a gate insulating layer GI, an interlayer insulating layer ILD, a via insulating layer VIA, a pixel defining layer PDL, a first light emitting element ED1, a second light emitting element ED2, a third light emitting element ED3, an encapsulation layer ENC, a second substrate SUB2, a first color filter CF1, a second color filter CF2, a third color filter CF3, a refractive layer LR, a first protective layer PTL1, a first color conversion layer QD1, a second color conversion layer QD2, a third color conversion layer QD3, a bank layer BK, and a second protective layer PTL2.

The first transistor TFT1 may include a first active layer ACT1, a first gate electrode GE1, a first upper electrode CE1, and a second upper electrode CE2. The second transistor TFT2 may include a second active layer ACT2, a second gate electrode GE2, a third upper electrode CE3, and a fourth upper electrode CE4. The third transistor TFT3 may include a third active layer ACT3, a third gate electrode GE3, a fifth upper electrode CE5, and a sixth upper electrode CE6.

The first light emitting element ED1 may include a first anode electrode AD1, a middle layer ML, and a cathode electrode CATH. The second light emitting element ED2 may include a second anode electrode AD2, the middle layer ML, and the cathode electrode CATH. The third light emitting element ED3 may include a third anode electrode AD3, the middle layer ML, and the cathode electrode CATH.

In an embodiment, the first substrate SUB1 may include a glass. In this case, the first substrate SUB1 may have a relatively high rigidity. In another embodiment, the first substrate SUB1 may include a plastic. In this case, the first substrate SUB1 may have a relatively high ductility.

The first lower electrode BML1, the second lower electrode BML2, the third lower electrode BML3 may be disposed on the first substrate SUB1. The first lower electrode BML1, the second lower electrode BML2, the third lower electrode BML3 may receive a signal. The first lower electrode BML1, the second lower electrode BML2, the third lower electrode BML3 may block or reduce an external light. The first lower electrode BML1, the second lower electrode BML2, the third lower electrode BML3 may include a metal, a metal oxide, a metal nitride, etc.

The buffer layer BUF may be disposed on the first substrate SUB1. The buffer layer BUF may include an inorganic insulating material. The buffer layer BUF may prevent or reduce metal atoms or impurities from diffusing into the first to third active layers ACT1, ACT2, and ACT3. In some embodiments, the buffer layer BUF may control rate of heat provided to the first to third active layers ACT1, ACT2, and ACT3 during crystallization process for forming the first to third active layers ACT1, ACT2, and ACT3.

The first active layer ACT1, the second active layer ACT2, and the third active layer ACT3 may be disposed on the buffer layer BUF. In an embodiment, the first active layer ACT1, the second active layer ACT2, and the third active layer ACT3 may include a silicon semiconductor. In another embodiment, the first active layer ACT1, the second active layer ACT2, and the third active layer ACT3 may include an oxide semiconductor.

The gate insulating layer GI may be disposed on the first active layer ACT1, the second active layer ACT2, and the third active layer ACT3. The gate insulating layer GI may insulate the first active layer ACT1, the second active layer ACT2, and the third active layer ACT3 from the first gate electrode GE1, the second gate electrode GE2, and the third gate electrode GE3. The gate insulating layer GI may include an inorganic insulating material.

The first gate electrode GE1, the second gate electrode GE2, and the third gate electrode GE3 may be disposed on the gate insulating layer GI. Although the first to third gate electrodes GE1, GE2, and GE3 overlap the gate insulating layer GI in FIG. 2, the present disclosure is not limited thereto. For example, a cross-sectional length of each of the first gate electrode GE1, the second gate electrode GE2, and the third gate electrode GE3 may be shorter than a cross-sectional length of the gate insulating layer GI. Each of the first gate electrode GE1, the second gate electrode GE2, and the third gate electrode GE3 may partially overlap the first active layer ACT1, the second active layer ACT2, and the third active layer ACT3. When a gate signal is provided to the first gate electrode GE1, a second gate electrode GE2, and a third gate electrode GE3, the first active layer ACT1, the second active layer ACT2, and the third active layer ACT3 may have conductivity. The first gate electrode GE1, the second gate electrode GE2, and the third gate electrode GE3 may include a metal, a metal oxide, a metal nitride, etc.

The interlayer insulating layer ILD may be disposed on the gate insulating layer GI. The interlayer insulating layer ILD may cover the first gate electrode GE1, the second gate electrode GE2, and the third gate electrode GE3. The interlayer insulating layer ILD may include an inorganic insulating material.

The first upper electrode CE1, the second upper electrode CE2, the third upper electrode CE3, the fourth upper electrode CE4, the fifth upper electrode CE5, and the sixth upper electrode CE6 may be disposed on the interlayer insulating layer ILD. Each of the first upper electrode CE1 and the second upper electrode CE2 may be connected to the first active layer ACT1 through contact holes. The second upper electrode CE2 may be connected to the first lower electrode BML1 through a contact hole. The first upper electrode CE1 and the second upper electrode CE2 may be a source electrode and a drain electrode. Each of the third upper electrode CE3 and the fourth upper electrode CE4 may be connected to the second active layer ACT2 through contact holes. The fourth upper electrode CE4 may be connected to the second lower electrode BML2 through contact holes. The third upper electrode CE3 and the fourth upper electrode CE4 may be a source electrode and a drain electrode. Each of the fifth upper electrode CE5 and the sixth upper electrode CE6 may be connected to the third active layer ACT3 through contact holes. The sixth upper electrode CE6 may be connected to the third lower electrode BML3 through contact holes. The fifth upper electrode CE5 and the sixth upper electrode CE6 may be a source electrode and a drain electrode. Each of the first upper electrode CE1, the second upper electrode CE2, the third upper electrode CE3, the fourth upper electrode CE4, the fifth upper electrode CE5, and the sixth upper electrode CE6 may include a metal, a metal oxide, a metal nitride, etc.

The via insulating layer VIA may be disposed on the interlayer insulating layer ILD. The via insulating layer VIA may cover the first upper electrode CE1, the second upper electrode CE2, the third upper electrode CE3, the fourth upper electrode CE4, the fifth upper electrode CE5, and the sixth upper electrode CE6. An upper surface of the via insulating layer VIA may be substantially flat surface. The via insulating layer VIA may include an organic material.

As shown in FIG. 2B, a passivation layer PVX may be disposed between the via insulating layer VIA and the interlayer insulating layer ILD. The passivation layer PXV may include an inorganic insulating material.

The first anode electrode AD1, the second anode electrode AD2, and the third anode electrode AD3 may be disposed on the via insulating layer VIA. The first anode electrode AD1 may be connected to the second upper electrode CE2, the second anode electrode AD2 may be connected to the fourth upper electrode CE4, and the third anode electrode AD3 may be connected to the sixth upper electrode CE6. The first anode electrode AD1, the second anode electrode AD2, and the third anode electrode AD3 may include a metal, a metal oxide, a metal nitride, etc.

The pixel defining layer PDL may be disposed on the via insulating layer VIA. The pixel defining layer PDL may define openings exposing each of the first anode electrode AD1, the second anode electrode AD2, and the third anode electrode AD3. The pixel defining layer PDL may include an organic insulating material.

The middle layer ML may be disposed on the first anode electrode AD1, the second anode electrode AD2, and the third anode electrode AD3. The middle layer ML may include an organic material emitting a light having a specific wavelength. For example, the middle layer ML may include an organic material emitting a blue light. The middle layer ML may emit the light based on a potential difference between the first to third anode electrodes AD1, AD2, and AD3 and the cathode electrode CATH. The middle layer ML may include an electron injection layer, an electron transport layer, a light emitting layer, a hole transport layer, and a hole injection layer. The middle layer ML may include a plurality of light emitting layers. For example, the middle layer ML may have a structure in which three light emitting layers emitting blue light are stacked. In another example, the middle layer ML may have a structure in which three light emitting layers emitting blue light and one light emitting layer emitting green light are stacked.

The cathode electrode CATH may be disposed on the middle layer ML. The cathode electrode CATH may include a metal, a metal oxide, a metal nitride, etc.

The encapsulation layer ENC may be disposed on the cathode electrode CATH. The encapsulation layer ENC may have a structure in which a first inorganic layer, an organic layer, and a second inorganic layer are stacked. An upper surface of the encapsulation layer ENC may have a substantially flat surface.

The first substrate SUB1, the first lower electrode BML1, the second lower electrode BML2, the third lower electrode BML3, the buffer layer BUF, the first transistor TFT1, the second transistor TFT2, the third transistor TFT3, the gate insulating layer GI, the interlayer insulating layer ILD, the via insulating layer VIA, the pixel defining layer PDL, the first light emitting element ED1, the second light emitting element ED2, the third light emitting element ED3, the encapsulation layer ENC may define (e.g., refer to as or form) a light emitting element substrate.

In an embodiment, the second substrate SUB2 may include a glass. In this case, the second substrate SUB2 may have a relatively high rigidity. In another embodiment, the second substrate SUB2 may include a plastic. In this case, the second substrate SUB2 may have a relatively high ductility.

The first color filter CF1, the second color filter CF2, and the third color filter CF3 may be disposed on the second substrate SUB2. The first color filter CF1, the second color filter CF2, and the third color filter CF3 may filter light emitted from the middle layer ML. In some areas, the first color filter CF1, the second color filter CF2, and the third color filter CF3 may overlap each other. For example, in a light blocking area OLA, the first color filter CF1, the second color filter CF2, and the third color filter CF3 may overlap each other. In this case, the light L emitted from the middle layer ML may not pass through the light blocking area OLA.

The refractive layer LR may be disposed on the first color filter CF1, the second color filter CF2, and the third color filter CF3. The refractive layer LR may control the path of the light L. For example, the refractive layer LR may change the path of light in a direction perpendicular to the second substrate SUB2. The refractive layer LR may include a polymer material and a silica-based material. Moisture may easily penetrate through the refractive layer LR. Moisture penetrating through the refractive layer LR may damage the display device DD.

The first protective layer PTL1 may be disposed on the refractive layer LR. The first protective layer PTL1 may include an inorganic insulating material. The first protective layer PTL1 may protect the refractive layer LR.

The bank layer BK, the first color conversion layer QD1, the second color conversion layer QD2, and the third color conversion layer QD3 may be disposed on the first protective layer PTL1. The bank layer BK may partition the first color conversion layer QD1, the second color conversion layer QD2, and the third color conversion layer QD3 from each other. The bank layer BK may overlap the pixel defining layer PDL. The bank layer BK may include an organic insulating material. The first color conversion layer QD1, the second color conversion layer QD2, and the third color conversion layer QD3 may convert a wavelength of the light L emitted from the first light emitting element ED1, the second light emitting element ED2, and the third light emitting element ED3. For example, each of the first light emitting element ED1, the second light emitting element ED2, and the third light emitting element ED3 may emit blue light. The first color conversion layer QD1 may convert the blue light to red light, the second color conversion layer QD2 may convert the blue light to green light, and the third color conversion layer QD3 may transmit the blue light.

The second protective layer PTL2 may cover the bank layer BK, the first color conversion layer QD1, the second color conversion layer QD2, and the third color conversion layer QD3. The second protective layer PTL2 may protect the bank layer BK, the first color conversion layer QD1, the second color conversion layer QD2, and the third color conversion layer QD3. The second protective layer PTL2 may include an inorganic insulating material.

The second substrate SUB2, the first color filter CF1, the second color filter CF2, the third color filter CF3, the refractive layer LR, the first protective layer PTL1, the first color conversion layer QD1, the second color conversion layer QD2, the third color conversion layer QD3, the bank layer BK, and the second protective layer PTL2 may define an upper substrate. In an embodiment, a method of manufacturing the display device DD may include manufacturing the light emitting element substrate, manufacturing the upper substrate, and combining the light emitting element substrate and the upper substrate. In this case, a sealing material and a filler material may bond the light emitting element substrate and the upper substrate.

Figure 3:
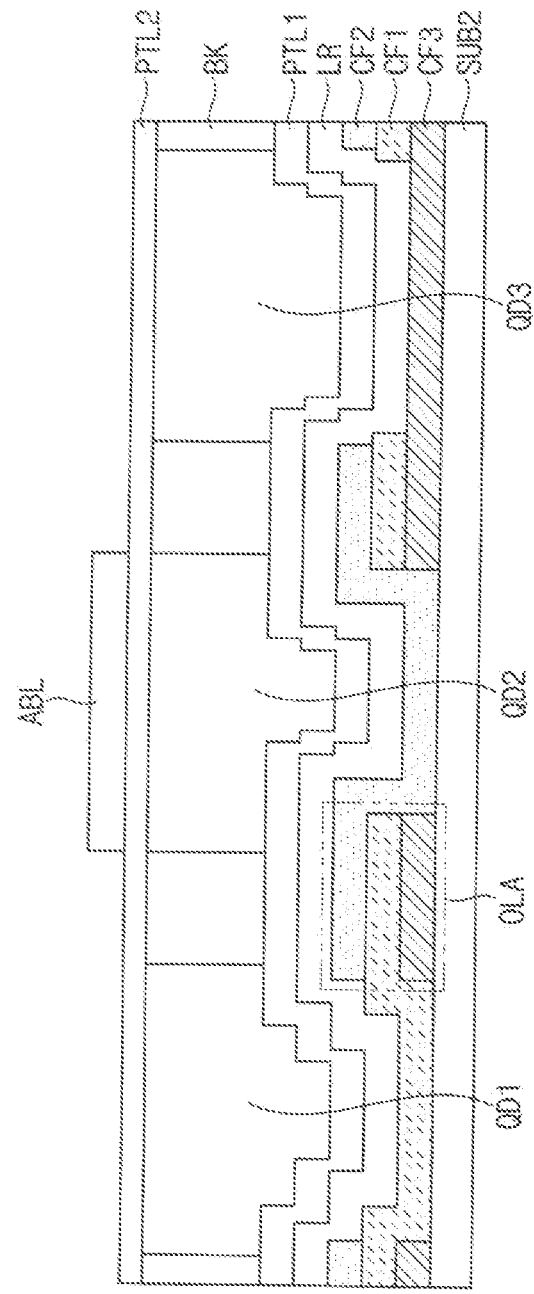
FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, and FIG. 18 are diagrams illustrating an upper substrate included in the display device of FIG. 1 according to embodiments of the present disclosure.

FIG. 3 is a diagram illustrating an upper substrate included in the display device of FIG. 1 according to a first embodiment of the present disclosure.

Referring to FIG. 3, the upper substrate may further include a light buffer layer ABL. The light buffer layer ABL may be disposed on the second protective layer PTL2. In an embodiment, the light buffer layer ABL may overlap the second color conversion layer QD2. In another embodiment, the light buffer layer ABL may overlap the first color conversion layer QD1 and the third color conversion layer QD3. Hereinafter, an embodiment in which the light buffer layer ABL is disposed to overlap the second color conversion layer QD2 will be described.

In the present disclosure, in the process of manufacturing the first color conversion layer QD1, the second color conversion layer QD2, and the third color conversion layer QD3, the first color conversion layer QD1, the second color conversion layer QD2, and the third color conversion layer QD3 may be irradiated by light having wavelength range of about 380 nm to about 400 nm. In this case, an overshooting (e.g., increase in efficiency) of each of the first color conversion layer QD1, the second color conversion layer QD2, and the third color conversion layer QD3 may occur. Accordingly, when the display device DD is driven, overshooting of each of the first color conversion layer QD1, the second color conversion layer QD2, and the third color conversion layer QD3 may not substantially occur due to the light L emitted from the light emitting element substrate.

When the overshooting occurs, a durability of the display device DD may be relatively reduced. To prevent this, in the process of manufacturing the first color conversion layer QD1, the second color conversion layer QD2, each of the first color conversion layer QD1, the second color conversion layer QD2, and the third color conversion layer QD3 may be irradiated by light having an appropriate wavelength. The appropriate wavelength may be different depending on materials included in each of the first color conversion layer QD1, the second color conversion layer QD2, and the third color conversion layer QD3. However, in order to prevent the overshooting by irradiating light having different wavelengths to the first color conversion layer QD1, the second color conversion layer QD2, and the third color conversion layer QD3, a lot of time and money may be consumed, and technical difficulties also may be accompanied.

In the present disclosure, the light buffer layer ABL may control a transmittance of light. The light buffer layer ABL may control transmittance of light applied to the second color conversion layer QD2 when light is applied to the first color conversion layer QD1, the second color conversion layer QD2, and the third color conversion layer QD3. For example, the light buffer layer ABL may have a transmittance of about 50% to about 90% for light having a wavelength of about 380 nm to about 400 nm, and a transmittance of about 90% or more for light having a wavelength of about 410 nm or more. In this case, the light buffer layer ABL may have a transmittance of about 95% or more for light having a wavelength of about 430 nm or more. Due to the light buffer layer ABL, amount of light having a relatively high wavelength irradiated to the second color conversion layer QD2 may be greater than the amount of light having a relatively low wavelength irradiated to the second color conversion layer QD2.

When light having a relatively high wavelength is applied to the material included in the second color conversion layer QD2, the overshooting may be prevented or reduced, and when light having a relatively low wavelength is applied to the material included in the first color conversion layer QD1, the overshooting may be prevented or reduced. Because the third color conversion layer QD3 corresponds to a light transmitting layer, the third color conversion layer QD3 may not include a color conversion material. Accordingly, effect of light applied to material included in the third color conversion layer QD3 may be substantially negligible.

In an embodiment, the light buffer layer ABL may include a solvent-free material (e.g., a solvent-free type or kind material). The solvent-free type or kind material has a vapor pressure of about 10-6 mmHg to about 10-3 mmHg, a surface energy of about 1 dyne/cm to about 20 dyne/cm, and a viscosity of about 1 cps to about 40 cps. For example, the solvent-free type material may include any one or more of an acrylic monomer and an isocyanate. Also, the light buffer layer ABL may further include at least one selected from the group consisting of polyacrylate, polyurethane, polyethylene, epoxy-based compound, and ester-based compound.

In an embodiment, the light buffer layer ABL may include a solvent type material. For example, the solvent type material may include at least one selected from the group consisting of propylene glycol monomethyl ether acetate (PGMEA), dimethylacetamide (DMA), cyclohexylamine (CHA), gamma-butyrolactone (GBL), N-methylpyrrolidone (NMP), and dipropylene glycol methyl ether acetate (DPMA). The light buffer layer ABL may use the solvent type material as a solvent. In this case, the light buffer layer ABL may include about 1 weight percent to about 25 weight percent of polymer or monomer solid content. In some embodiments, the light buffer layer ABL may further include at least one selected from the group consisting of a thermal curing agent and a light curing agent.

The light buffer layer ABL may include a chromophore compound or a conjugated organic compound in which multiple bonds are conjugated. The chromophore compound or the conjugated organic compound may absorb light having a wavelength of about 400 nm or less.

The chromophore compound may include at least one selected from the group consisting of chemical formula 1 to 7.

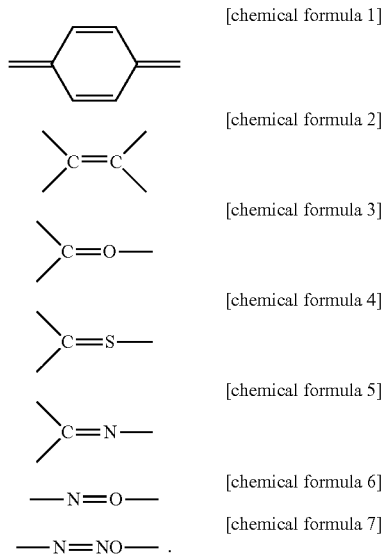

[chemical formula 1]

[chemical formula 2]

[chemical formula 3]

[chemical formula 4]

[chemical formula 5]

[chemical formula 6]

[chemical formula 7]

In an embodiment, the light buffer layer ABL may further include about 0.1 weight percent to about 10 weight percent of a pigment. For example, the light buffer layer ABL may additionally include blue pigment particles or yellow pigment particles. Examples of the blue pigment particles may include a phthalocyanine-based blue pigment, a cobalt blue-based blue pigment, a Prussian-based blue pigment, and a turquoise blue-based pigment. These may be used alone or in combination with each other.

In an embodiment, the light buffer layer ABL may include an inorganic compound. An example of the inorganic compound may be a silicon compound, a silver compound, a zinc compound, a selenium compound, etc. These may be used alone or in combination with each other. However, in embodiments, inorganic particles may be mixed in a material (for example, ink) constituting the second color conversion layer QD2 and used together when forming the second color conversion layer QD2.

Each of the above-mentioned materials may be used alone, but may also be used in combination with each other.

Figure 4:
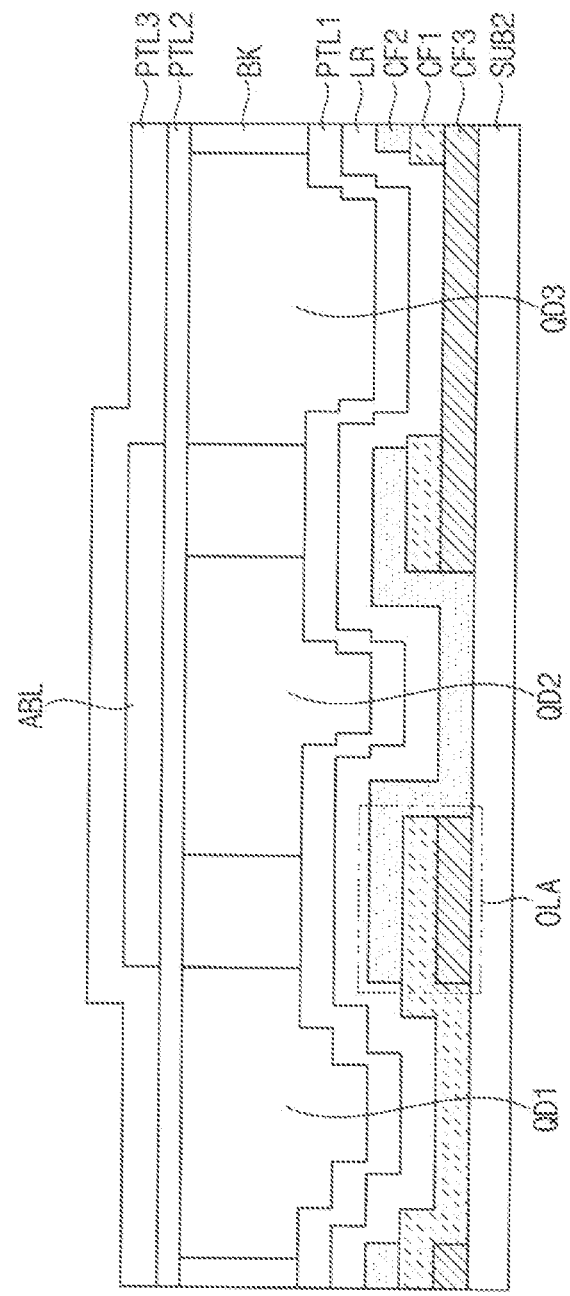

FIG. 4 is a diagram illustrating an upper substrate included in the display device of FIG. 1 according to a second embodiment of the present disclosure. FIG. 4 may be substantially the same as FIG. 3, except that a third protective layer PTL3 is disposed to cover the light buffer layer ABL. Accordingly, descriptions of substantially the same or similar components will not be provided.

Referring to FIG. 4, the third protective layer PTL3 may include the same material as the second protective layer PTL2. As the third protective layer PTL3 and the second protective layer PTL2 are disposed together, the first color conversion layer QD1, the second color conversion layer QD2, and the third color conversion layer QD3 may be effectively protected from moisture or external impact.

Figure 5:
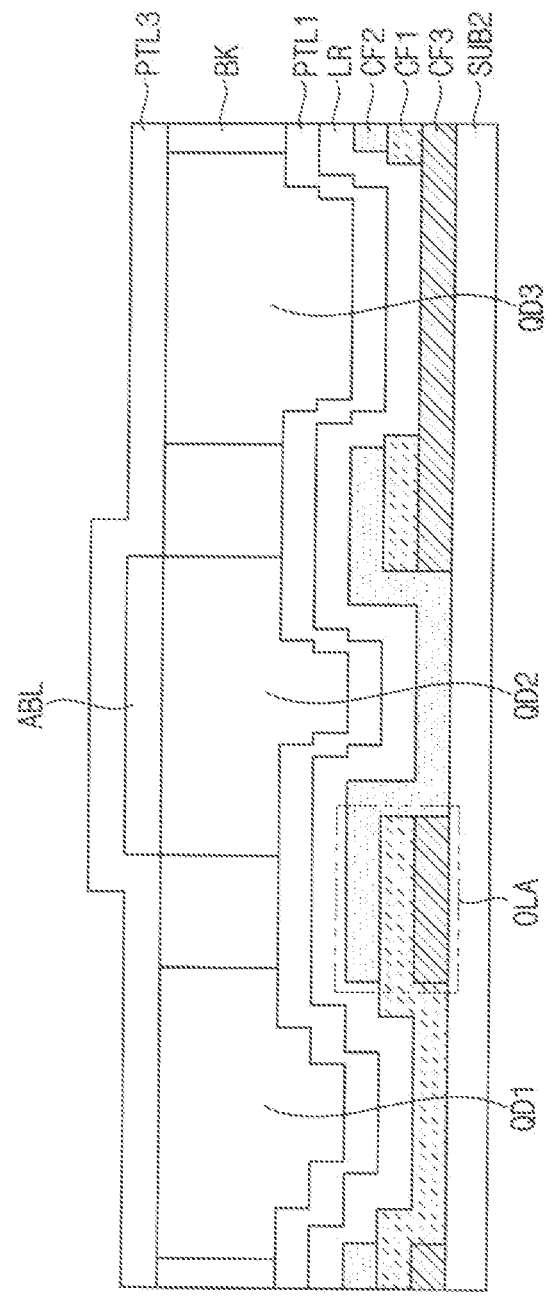

FIG. 5 is a diagram illustrating an upper substrate included in the display device of FIG. 1 according to a third embodiment of the present disclosure. FIG. 5 may be substantially the same as FIG. 4, except that the second protective layer PTL2 is not disposed. Accordingly, descriptions of substantially the same or similar components will not be provided.

Figure 6:
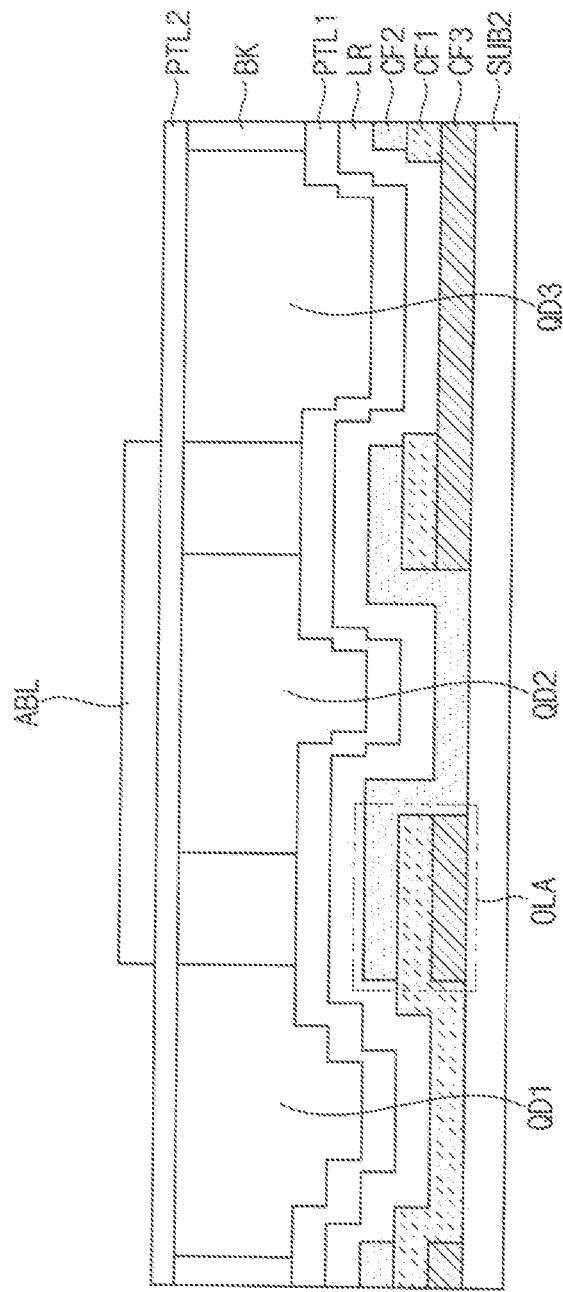

FIG. 6 is a diagram illustrating an upper substrate included in the display device of FIG. 1 according to a fourth embodiment of the present disclosure. FIG. 6 may be substantially the same as FIG. 3, except that the light buffer layer ABL further overlaps the bank layer BK. Accordingly, descriptions of substantially the same or similar components will not be provided.

Referring to FIG. 6, the light buffer layer ABL may overlap the bank layer BK surrounding the second color conversion layer QD2.

Figure 7:
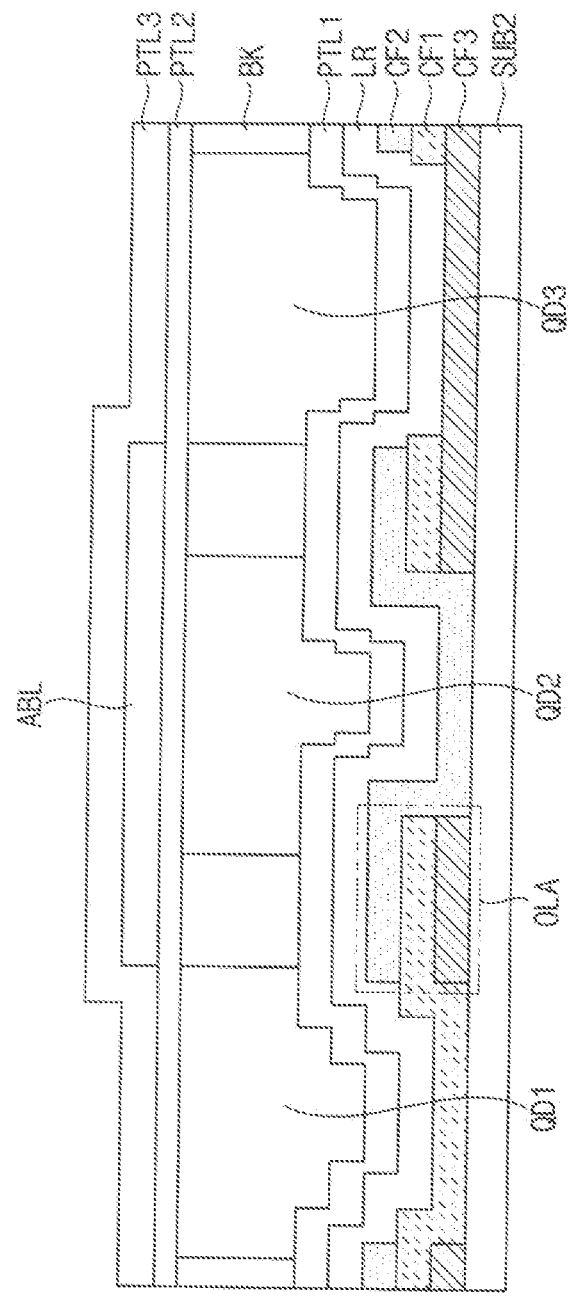

FIG. 7 is a diagram illustrating an upper substrate included in the display device of FIG. 1 according to a fifth embodiment of the present disclosure. FIG. 7 may be substantially the same as FIG. 6, except that the third protective layer PTL3 is disposed. Accordingly, descriptions of substantially the same or similar components will not be provided.

Figure 8:
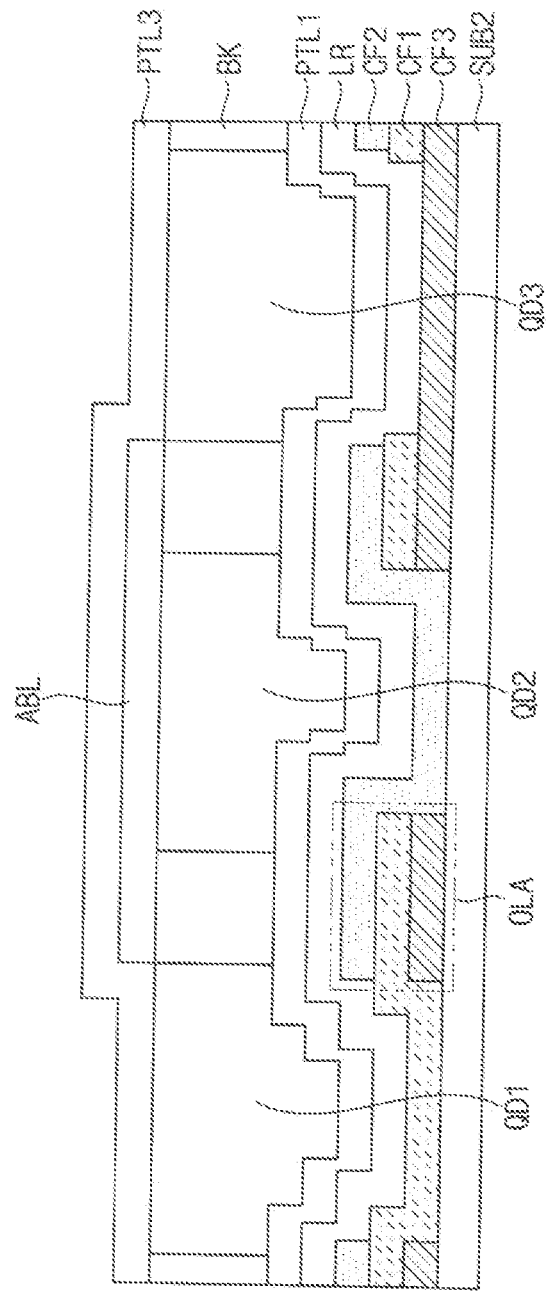

FIG. 8 is a diagram illustrating an upper substrate included in the display device of FIG. 1 according to a sixth embodiment of the present disclosure. FIG. 8 may be substantially the same as FIG. 7, except that the second protective layer PTL2 is not disposed. Accordingly, descriptions of substantially the same or similar components will not be provided.

Figure 9:
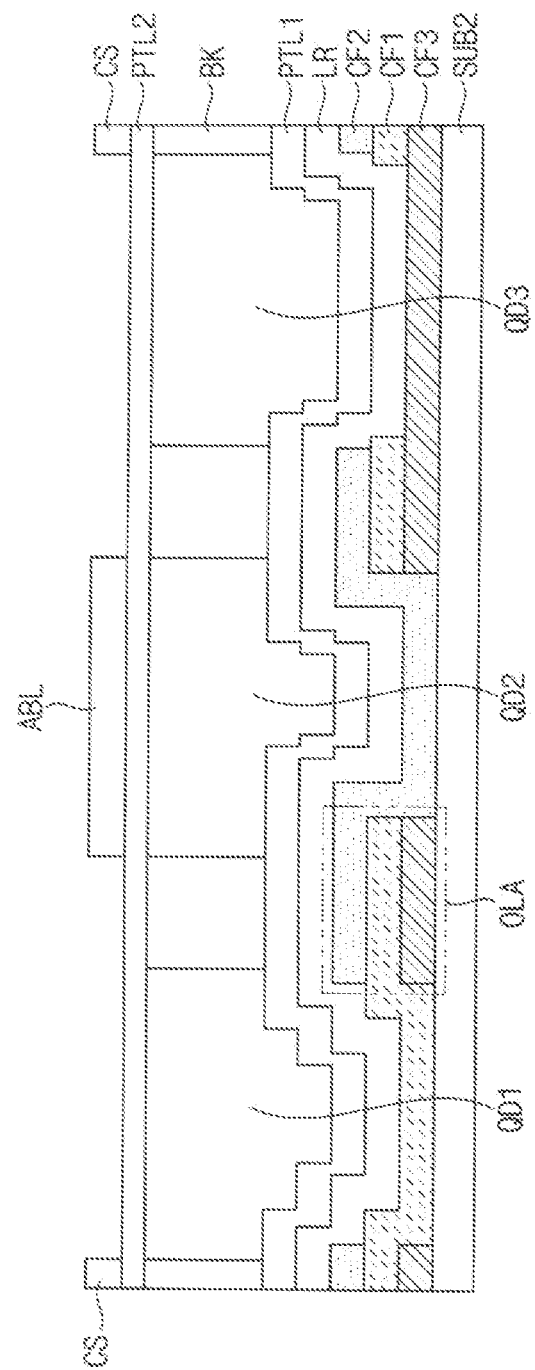

FIG. 9 is a diagram illustrating an upper substrate included in the display device of FIG. 1 according to a seventh embodiment of the present disclosure. FIG. 9 may be substantially the same as FIG. 3, except that a column spacer CS is disposed. Accordingly, descriptions of substantially the same or similar components will not be provided.

Referring to FIG. 9, the column spacer CS may be disposed to overlap the bank layer BK. Due to the column spacer CS, when the upper substrate and the light emitting element substrate are coupled, a cell gap may be maintained. The column spacer CS may include the same material as the light buffer layer ABL. Or, the column spacer CS may include a transparent material such as glass or frit. Or, the column spacer CS may include an organic insulating material.

Figure 10:
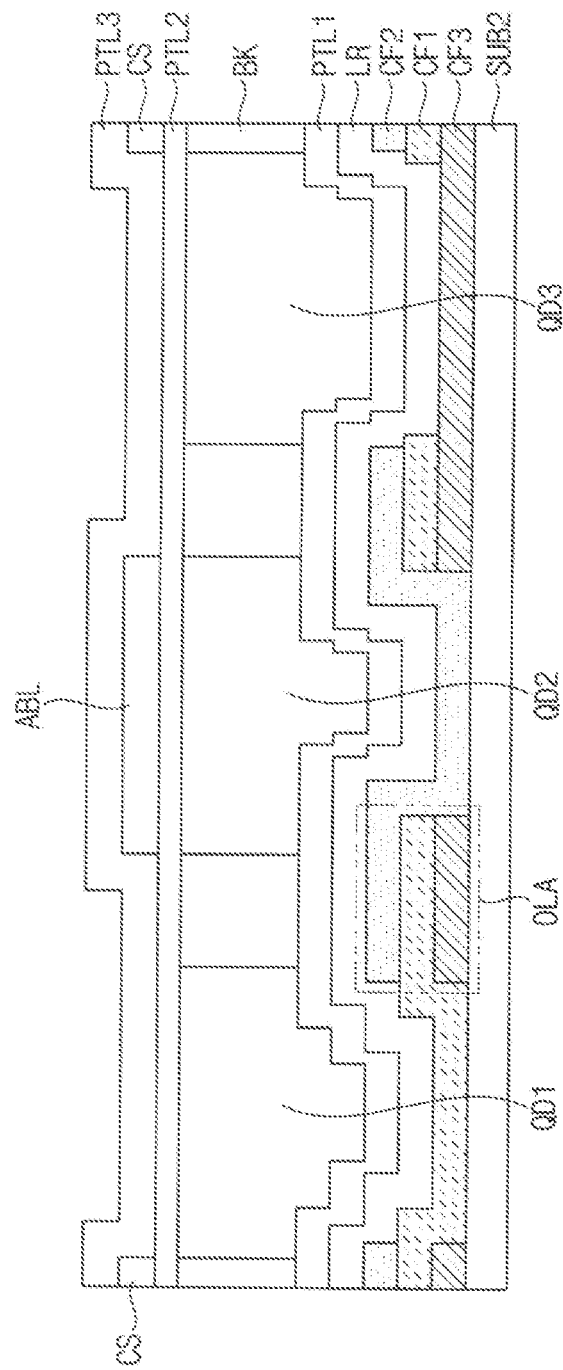

FIG. 10 is a diagram illustrating an upper substrate included in the display device of FIG. 1 according to an eighth embodiment of the present disclosure. FIG. 10 may be substantially the same as FIG. 9, except that the third protective layer PTL3 is disposed. Accordingly, descriptions of substantially the same or similar components will not be provided.

Referring to FIG. 10, the third protective layer PTL3 may cover the light buffer layer ABL and the column spacer SC. As the third protective layer PTL3 and the second protective layer PTL2 are disposed together, the first color conversion layer QD1, the second color conversion layer QD2, and the third color conversion layer QD3 may be effectively protected from moisture or external impact.

Figure 11:
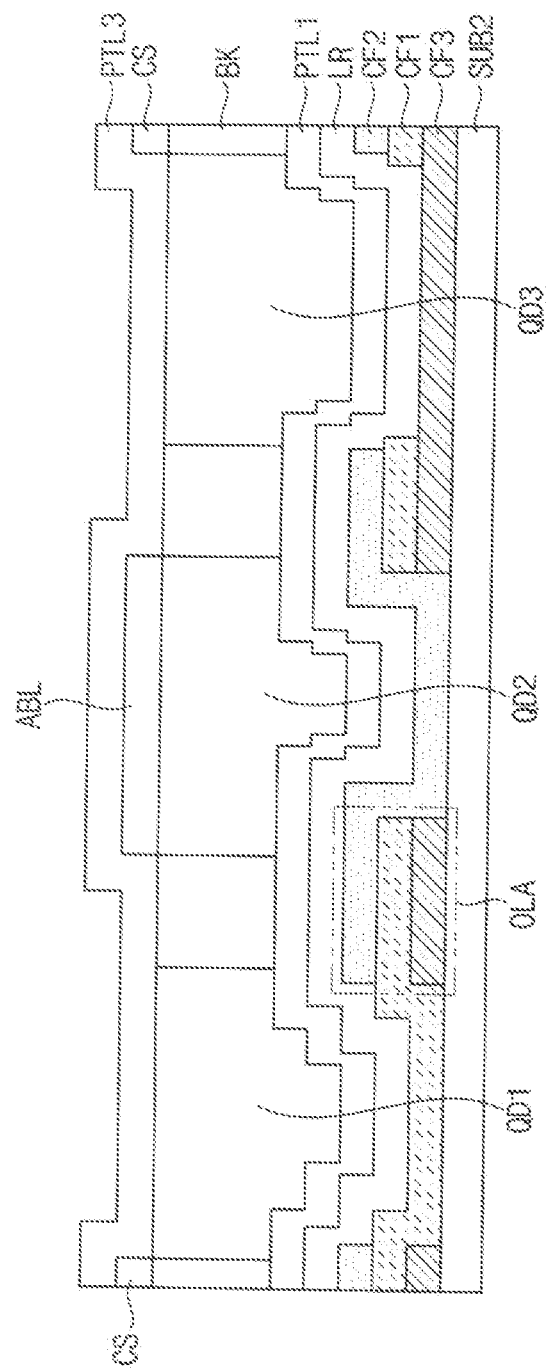

FIG. 11 is a diagram illustrating an upper substrate included in the display device of FIG. 1 according to a ninth embodiment. FIG. 11 may be substantially the same as FIG. 10, except that the second protective layer PTL2 is not disposed. Accordingly, descriptions of substantially the same or similar components will not be provided.

Figure 12:
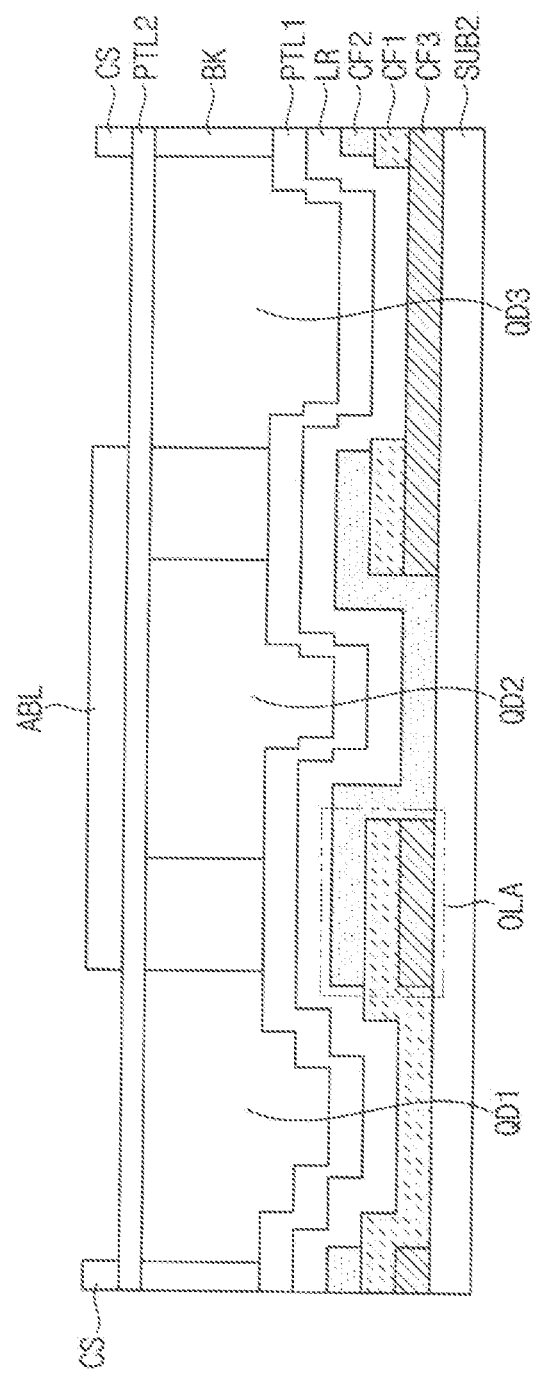

FIG. 12 is a diagram illustrating an upper substrate included in the display device of FIG. 1 according to a tenth embodiment. FIG. 12 may be substantially the same as FIG. 9, except that the light buffer layer ABL further overlaps the bank layer BK. Accordingly, descriptions of substantially the same or similar components will not be provided.

Figure 13:
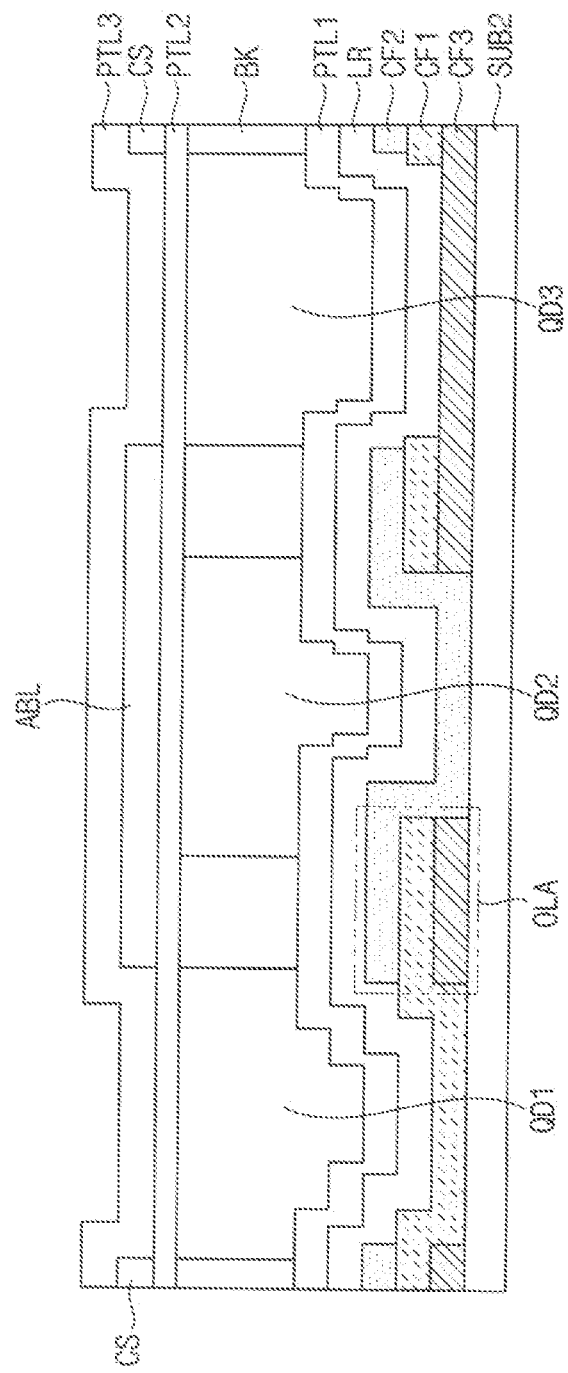

FIG. 13 is a diagram illustrating an upper substrate included in the display device of FIG. 1 according to a eleventh embodiment. FIG. 13 may be substantially the same as FIG. 12, except that the third protective layer PTL3 is disposed. Accordingly, descriptions of substantially the same or similar components will not be provided.

Figure 14:
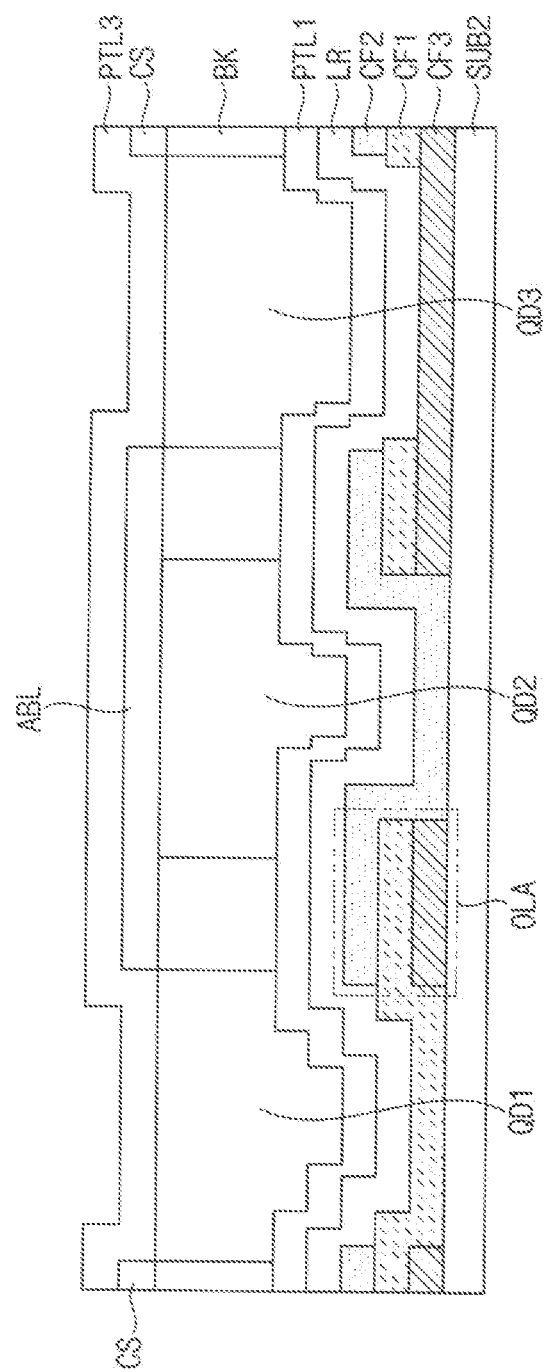

FIG. 14 is a diagram illustrating an upper substrate included in the display device of FIG. 1 according to a twelfth embodiment of the present disclosure. FIG. 14 may be substantially the same as FIG. 13, except that the second protective layer PTL2 is not disposed. Accordingly, descriptions of substantially the same or similar components will not be provided.

Figure 15:
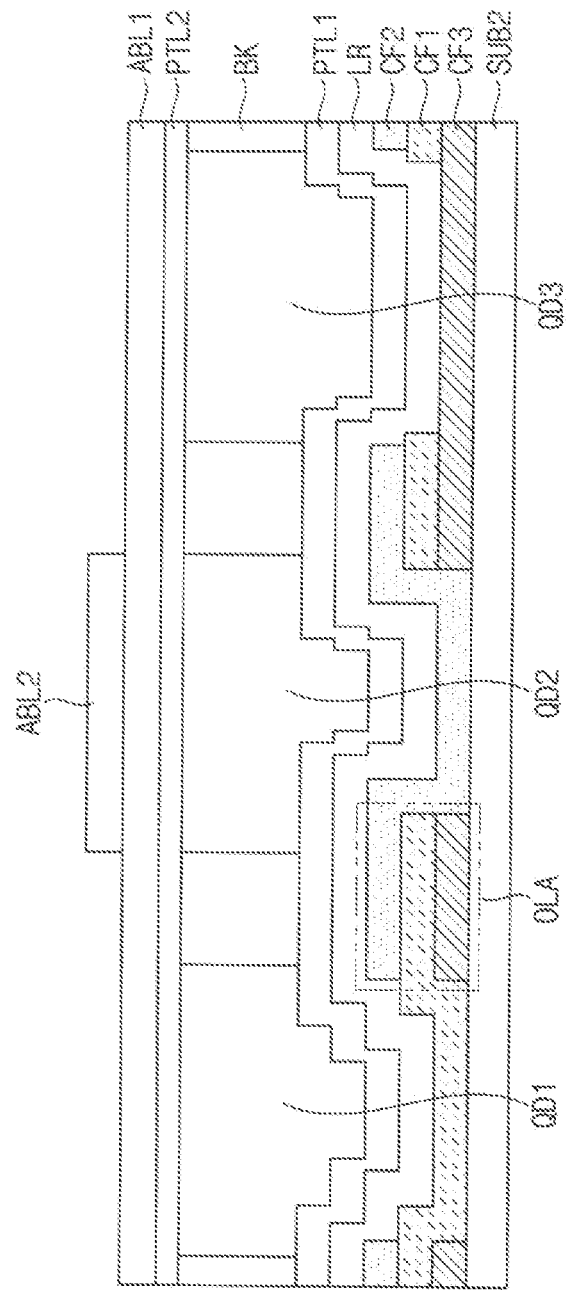

FIG. 15 is a diagram illustrating an upper substrate included in the display device of FIG. 1 according to a thirteenth embodiment of the present disclosure. FIG. 15 may be substantially the same as FIG. 3, except that a first light buffer layer ABL1 and a second light buffer layer ABL2. Accordingly, descriptions of substantially the same or similar components will not be provided.

Referring to FIG. 15, the first light buffer layer ABL1 may be disposed on the second protective layer PTL2. The first light buffer layer ABL1 may overlap the first color conversion layer QD1, the second color conversion layer QD2, and the third color conversion layer QD3, and the bank layer BK. The first light buffer layer ABL1 may control transmittance of light irradiated to the first color conversion layer QD1, the second color conversion layer QD2, and the third color conversion layer QD3.

The second light buffer layer ABL2 may be disposed on the first light buffer layer ABL1. The second light buffer layer ABL2 may overlap the second color conversion layer QD2. Accordingly, the second color conversion layer QD2 may be irradiated by light passing through the first light buffer layer ABL1 and the second light buffer layer ABL2.

Figure 16:
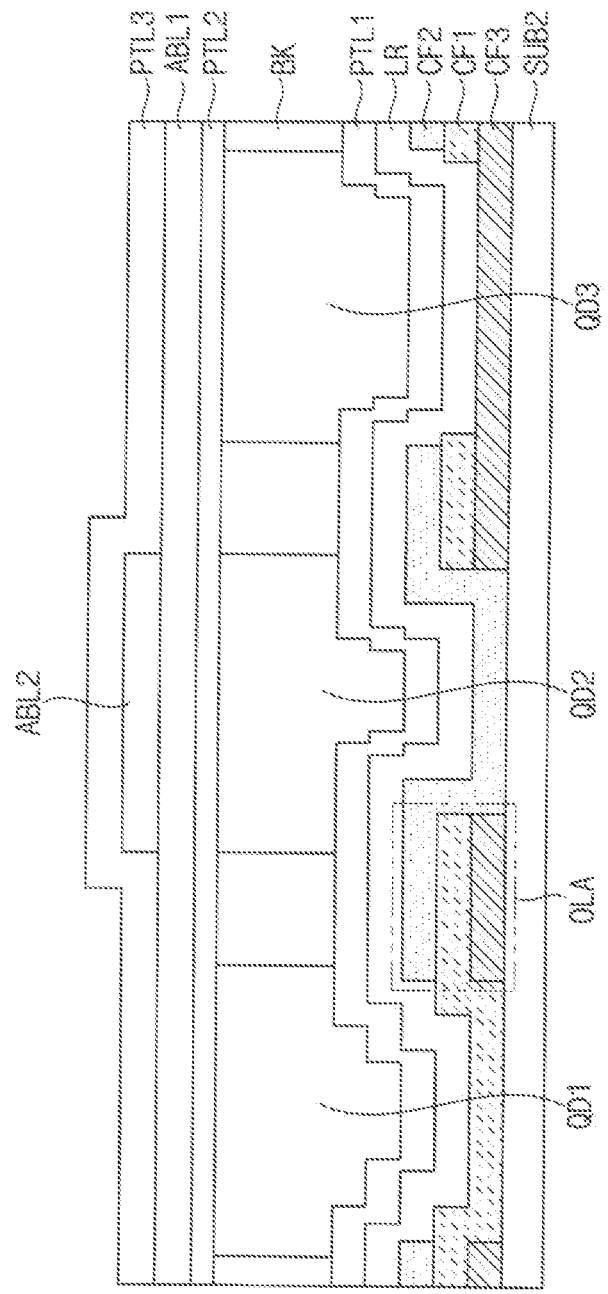

FIG. 16 is a diagram illustrating an upper substrate included in the display device of FIG. 1 according to a fourteenth embodiment of the present disclosure. FIG. 16 may be substantially the same as FIG. 15, except that the third protective layer PTL3 is disposed. Accordingly, descriptions of substantially the same or similar components will not be provided.

Figure 17:
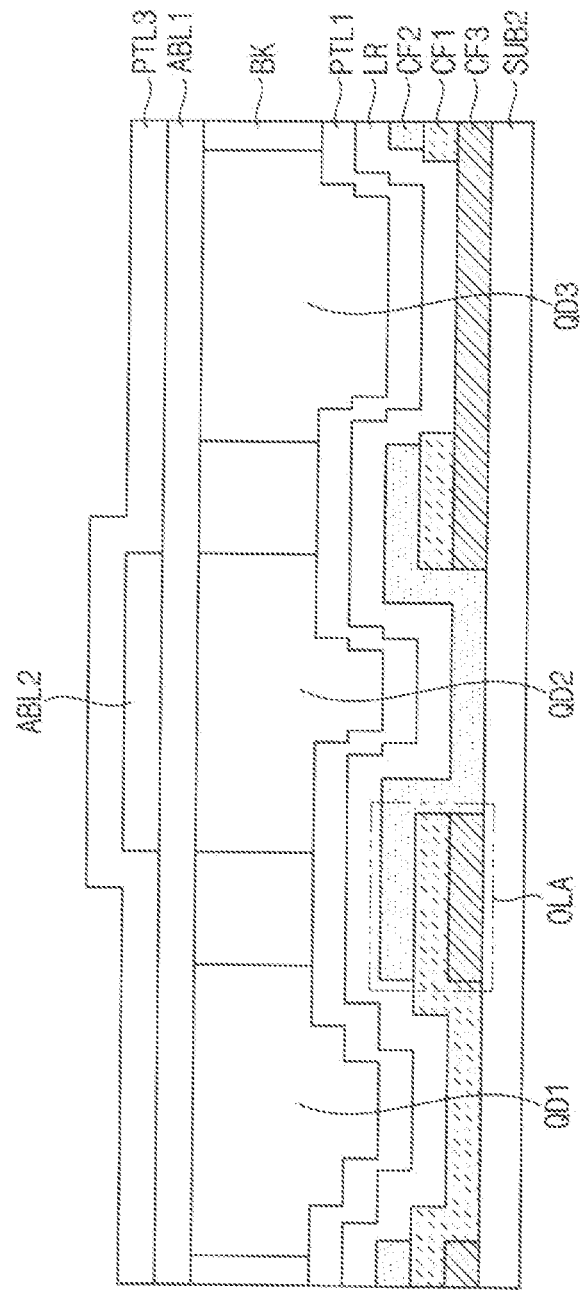

FIG. 17 is a diagram illustrating an upper substrate included in the display device of FIG. 1 according to a fifteenth embodiment of the present disclosure. FIG. 17 may be substantially the same as FIG. 16, except that the second protective layer PTL2 is not disposed. Accordingly, descriptions of substantially the same or similar components will not be provided.

Figure 18:
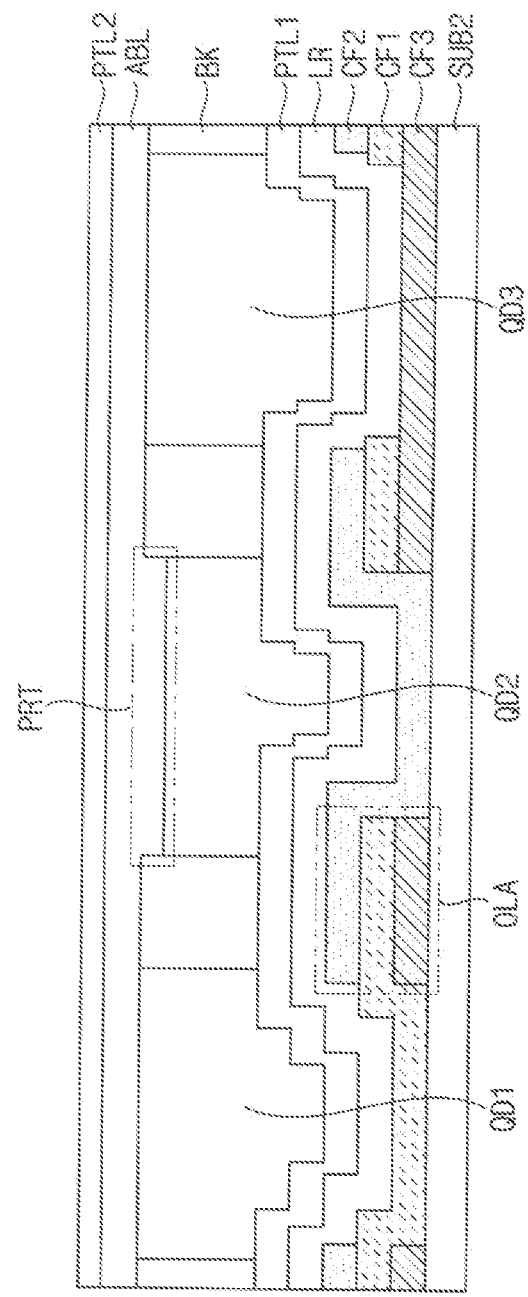

FIG. 18 is a diagram illustrating an upper substrate included in the display device of FIG. 1 according to a sixteenth embodiment of the present disclosure. FIG. 18 may be substantially the same as FIG. 3, except that the light buffer layer ABL includes a protrusion part protruding to a direction in which the bank layer BK is disposed, and a position in which the second protective layer PTL2 is disposed. Accordingly, descriptions of substantially the same or similar components will not be provided.

Referring to FIG. 18, the light buffer layer ABL may cover the first color conversion layer QD1, the second color conversion layer QD2, the third color conversion layer QD3, and the bank layer BK. The light buffer layer ABL may overlap the first color conversion layer QD1, the second color conversion layer QD2, the third color conversion layer QD3, and the bank layer BK. In this case, the light buffer layer ABL may include a protrusion part PRT protruding to a direction toward a layer in which the bank layer BK is disposed on. In other words, a thickness of the light buffer layer ABL overlapping the second color conversion layer QD2 may be greater than a thickness of the light buffer layer ABL overlapping the first color conversion layer QD1 and the third color conversion layer QD3. Accordingly, the second color conversion layer QD2 may be irradiated by light having a relatively high wavelength.

Figure 19:
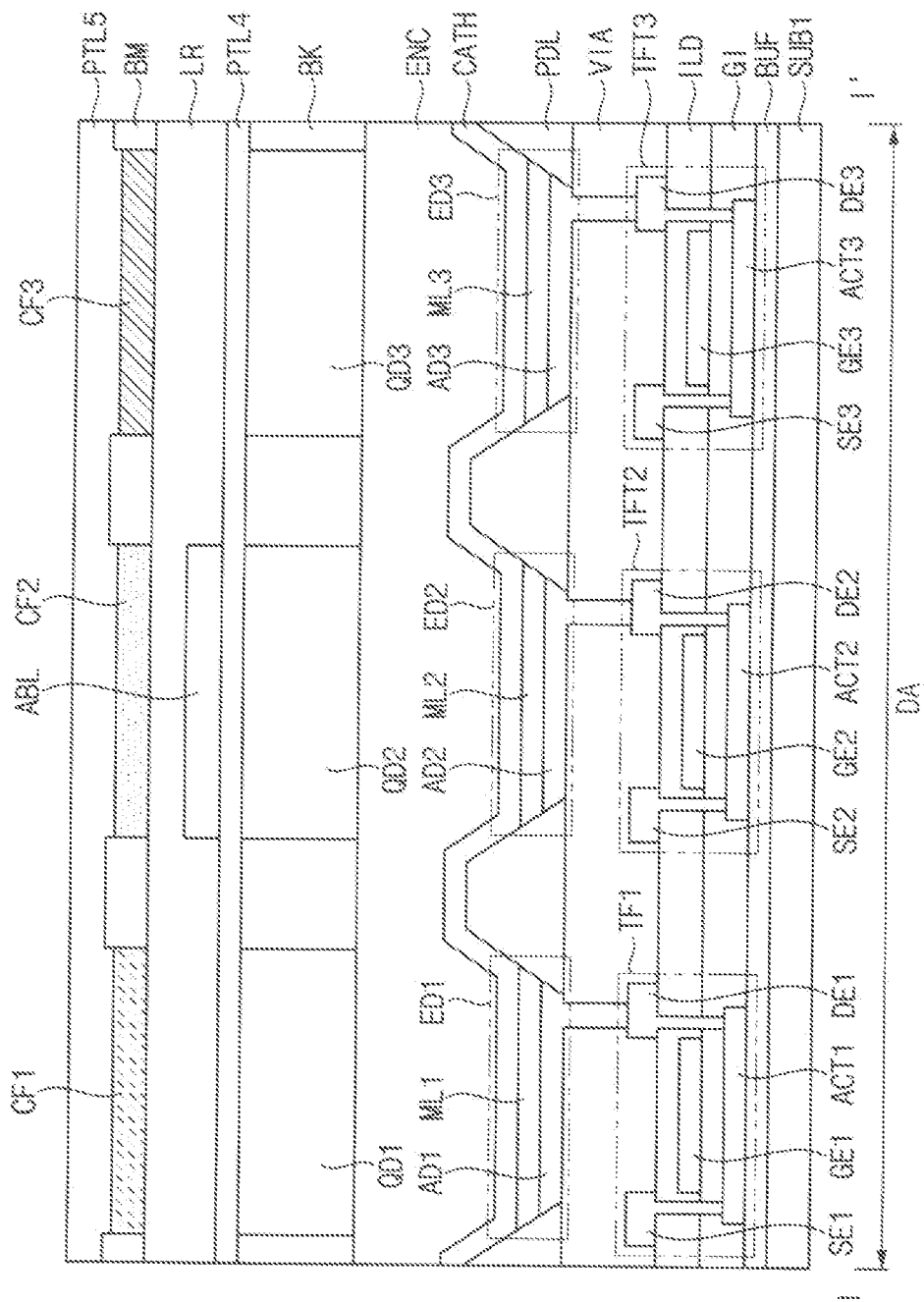
FIG. 19, FIG. 20, FIG. 21, FIG. 22, and FIG. 23 are cross-sectional views taken along a line I-I' of FIG. 1 according to embodiments of the present disclosure.

FIG. 19 is a cross-sectional view taken along a line I-I' of FIG. 1 according to an embodiment of the present disclosure.

Referring to FIG. 19, the first color conversion layer QD1, the second color conversion layer QD2, and the third color conversion layer QD3 may be disposed on the encapsulation layer ENC. The bank layer BK may partition the first color conversion layer QD1, the second color conversion layer QD2, and the third color conversion layer QD3 from each other. A fourth protective layer PTL4 may be disposed on the first color conversion layer QD1, the second color conversion layer QD2, the third color conversion layer QD3, and the bank layer BK. The light buffer layer ABL may be disposed on the fourth protective layer PTL4. The light buffer layer ABL may overlap the second color conversion layer QD2. The refractive layer LR may be disposed on the fourth protective layer PTL4 to cover the light buffer layer ABL. A black matrix BM may be disposed on the refractive layer LR. The black matrix BM may include a material blocking light. The black matrix BM may overlap the bank layer BK. The first color filter CF1, the second color filter CF2, and the third color filter CF3 may overlap the first color conversion layer QD1, the second color conversion layer QD2, and the third color conversion layer QD3 respectively. A fifth protective layer PTL5 may cover the first color filter CF1, the second color filter CF2, the third color filter CF3, and the black matrix BM. The fourth protective layer PTL4 and the fifth protective layer PTL5 may include substantially same material as the first protective layer PTL1, the second protective layer PTL2, and the third protective layer PTL3.

Figure 20:
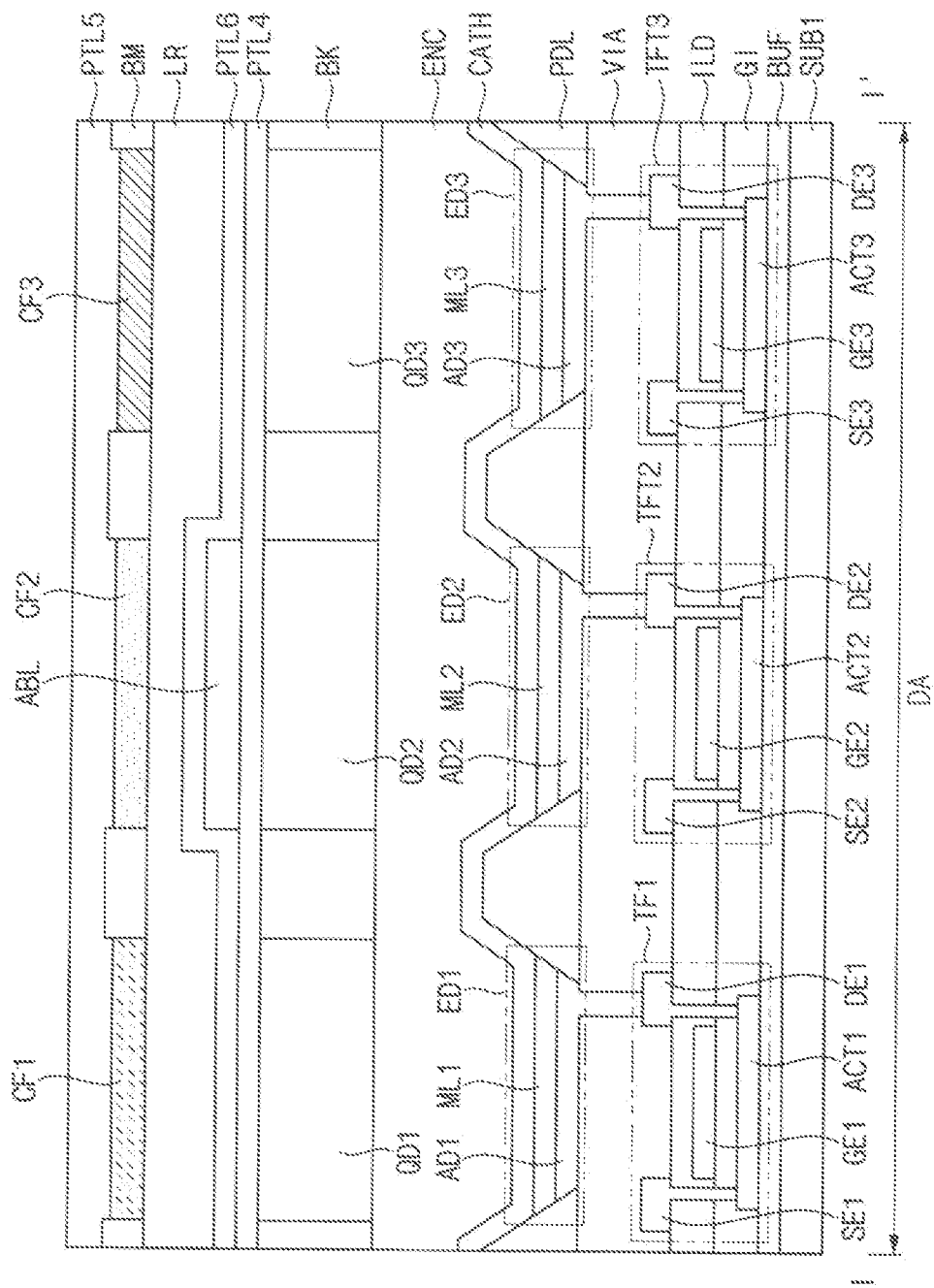

FIG. 20 is a cross-sectional view taken along a line I-I' of FIG. 1 according to an embodiment of the present disclosure. FIG. 20 may be substantially the same as FIG. 19, except that a sixth protective layer PTL6 is disposed. Accordingly, descriptions of substantially the same or similar components will not be provided.

Referring to FIG. 20, the sixth protective layer PTL6 may be disposed on the fourth protective layer PTL4 to cover the light buffer layer ABL.

Figure 21:
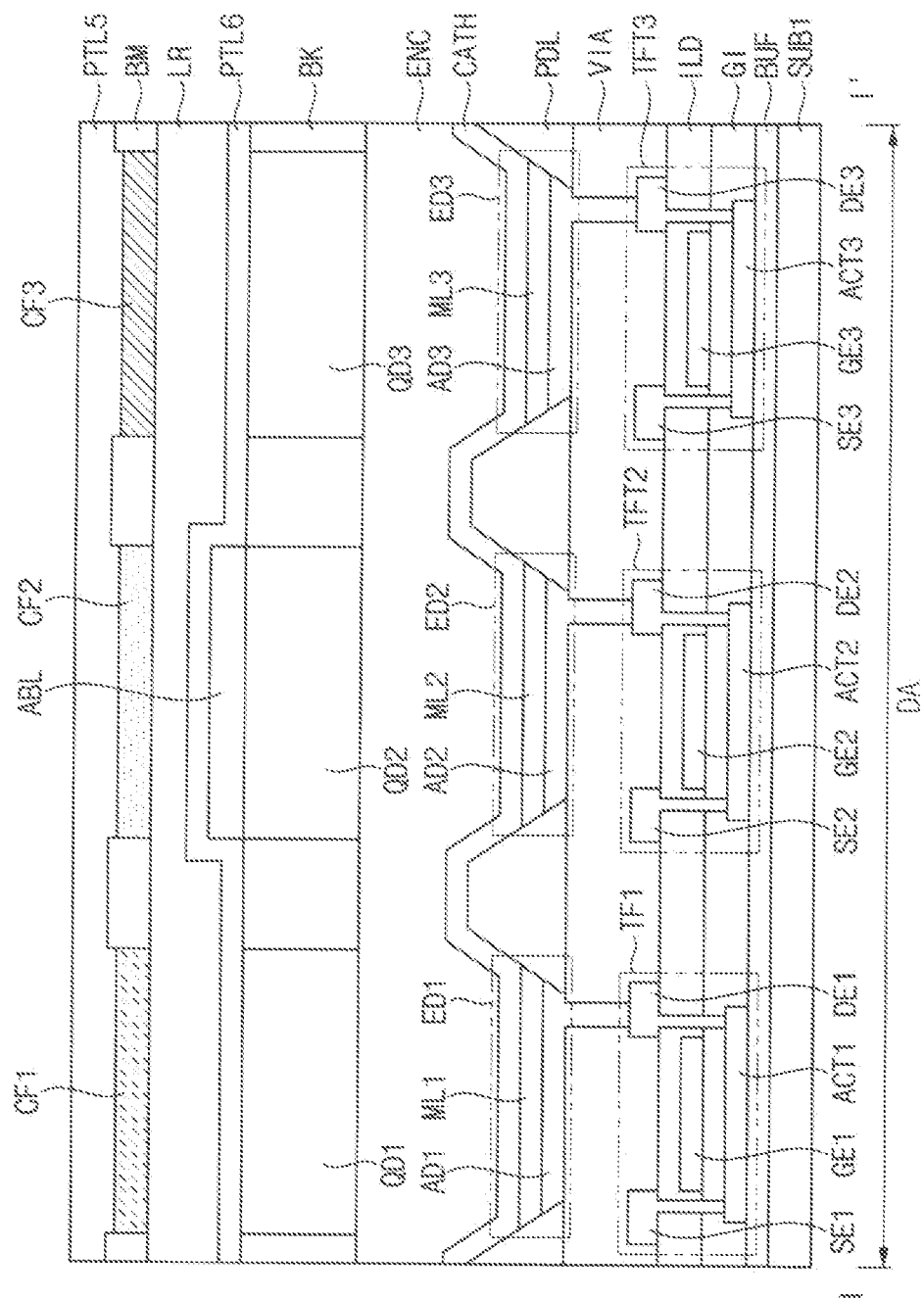

FIG. 21 is a cross-sectional view taken along a line I-I' of FIG. 1 according to an embodiment of the present disclosure. FIG. 21 may be substantially the same as FIG. 20, except that a fourth protective layer PTL4 is not disposed. Accordingly, descriptions of substantially the same or similar components will not be provided.

Figure 22:
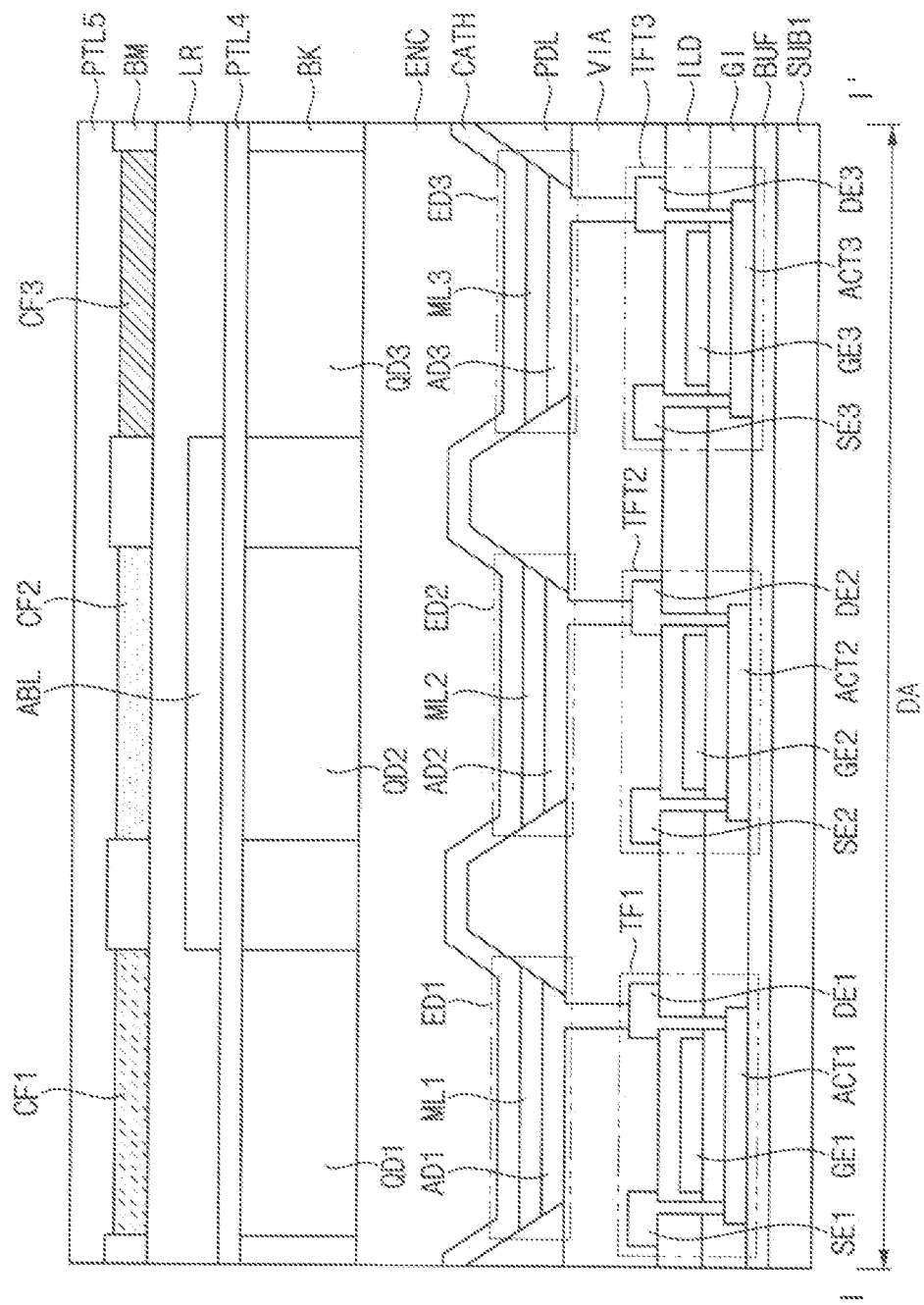

FIG. 22 is a cross-sectional view taken along a line I-I' of FIG. 1 according to an embodiment of the present disclosure. FIG. 22 may be substantially the same as FIG. 19, except that the light buffer layer ABL further overlaps the bank layer BK adjacent to the second color conversion layer QD2. Accordingly, descriptions of substantially the same or similar components will not be provided.

Figure 23:
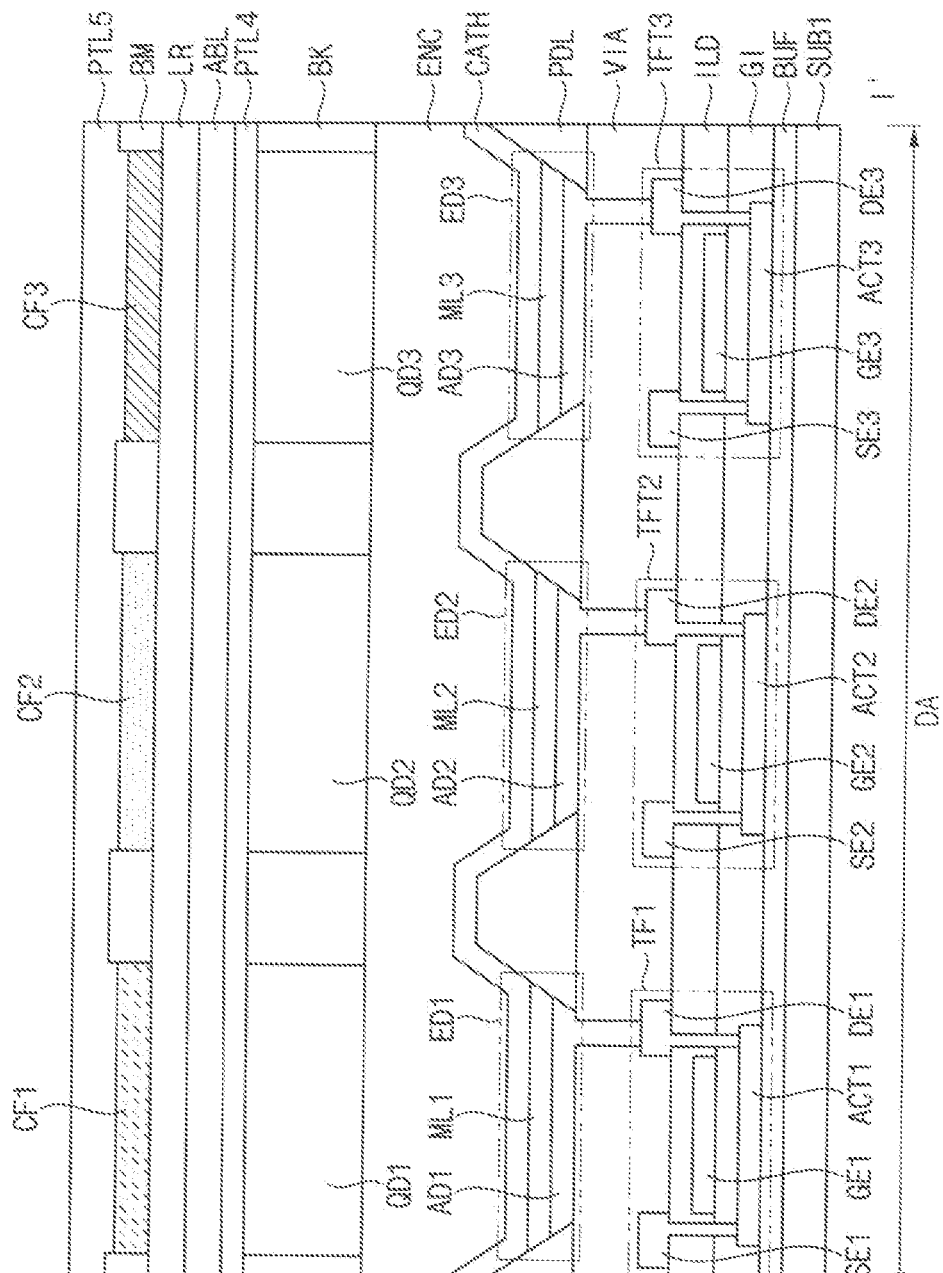

FIG. 23 is a cross-sectional view taken along a line I-I' of FIG. 1 according to an embodiment. FIG. 23 may be substantially the same as FIG. 19, except that the light buffer layer ABL further overlaps the bank layer BK, the first color conversion layer QD1, the second color conversion layer QD2, and the third color conversion layer QD3. Accordingly, descriptions of substantially the same or similar components will not be provided.

As used herein, expressions such as "at least one of a, b or c", "at least one selected from the group consisting of a, b and/or c", etc., may indicate only a, only b, only c, both (e.g., simultaneously) a and b, both (e.g., simultaneously) a and c, both (e.g., simultaneously) b and c, all of a, b, and c, or variations thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although certain embodiments and implementations have been described herein, other embodiments and modifications will be apparent from this description. Accordingly, the present disclosure is not limited to such embodiments, but rather to the broader scope of the appended claims and one or more suitable obvious modifications and equivalent arrangements as would be apparent to a person of ordinary skill in the art.

What is claimed is:

1. A display device comprising:
a light emitting element substrate comprising a plurality of driving elements and a first light emitting element, a second light emitting element, and a third light emitting element connected to the plurality of driving elements;
a first light buffer layer overlapping the first light emitting element, and on the light emitting element substrate;
a first color conversion layer overlapping the first light buffer layer on the first light buffer layer;
a second color conversion layer spaced apart from the first color conversion layer by a bank layer, and on a same layer as the first color conversion layer is on; and
a third color conversion layer spaced apart from the second color conversion layer by a bank layer, and on the same layer as the first color conversion layer and the second color conversion layer are on,
wherein the first light buffer layer is disposed between the first light emitting element and the first color conversion layer.

2. The display device of claim 1, wherein the first light buffer layer further overlaps the bank layer around the first color conversion layer.

3. The display device of claim 1, further comprising:
a column spacer overlapping the bank layer, and on the same layer as the first light buffer layer.

4. The display device of claim 1, further comprising a second light buffer layer between the first light buffer layer and the first color conversion layer, wherein the second light buffer layer overlaps the first color conversion layer, the second color conversion layer, and the third color conversion layer.

5. The display device of claim 1, wherein the first light buffer layer further overlaps the second color conversion layer and the third color conversion layer, and a portion of the first light buffer layer overlapping the first color conversion layer comprises a protrusion part protruding in a direction toward a layer in which the bank layer is on.

6. The display device of claim 1, further comprising:
a protective layer between the first light buffer layer and the light emitting element substrate.

7. The display device of claim 1, further comprising:
a protective layer between the first light buffer layer and the first color conversion layer.

8. A display device comprising:
a light emitting element substrate comprising a plurality of driving elements and a first light emitting element, a second light emitting element, and a third light emitting element connected to the plurality of driving elements;
a first light buffer layer overlapping the first light emitting element, and on the light emitting element substrate;
a first color conversion layer overlapping the first light buffer layer on the first light buffer layer;
a second color conversion layer spaced apart from the first color conversion layer by a bank layer, and on a same layer as the first color conversion layer is on;
a third color conversion layer spaced apart from the second color conversion layer by a bank layer, and on the same layer as the first color conversion layer and the second color conversion layer are on;
a first protective layer between the first light buffer layer and the light emitting element substrate; and
a second protective layer between the first light buffer layer and the first color conversion layer.

9. The display device of claim 1, further comprising:
a refractive layer on the first color conversion layer;
a first color filter, a second color filter, and a third color filter on the refractive layer; and
a glass substrate on the first color filter, the second color filter, and the third color filter.

10. The display device of claim 1, wherein the first light buffer layer comprises a solvent-free material, and the solvent-free material comprises at least one selected from the group consisting of an acrylic monomer and an isocyanate.

11. The display device of claim 10, wherein the first light buffer layer further comprises at least one selected from the group consisting of polyacrylate, polyurethane, polyethylene, epoxy-based compound, and ester-based compound.

12. The display device of claim 1, wherein the first light buffer layer comprises a solvent material, and the solvent material comprises at least one selected from the group consisting of propylene glycol monomethyl ether acetate (PGMEA), dimethylacetamide (DMA), cyclohexylamine (CHA), gamma-butyrolactone (GBL), N-methylpyrrolidone (NMP), and dipropylene glycol methyl ether acetate (DPMA).

13. The display device of claim 12, wherein the first light buffer layer further comprises at least one selected from the group consisting of thermal curing agent and a light curing agent.

14. The display device of claim 1, wherein the first light buffer layer comprises a chromophore compound.

15. The display device of claim 1, wherein the first light buffer layer comprises an inorganic compound.

16. The display device of claim 1, wherein the first light buffer layer comprises at least one selected from the group consisting of a blue pigment particle and a yellow pigment particle.

17. A display device comprising:
a light emitting element substrate comprising a plurality of driving elements and a first light emitting element, a second light emitting element, and a third light emitting element connected to the plurality of driving elements;
a first color conversion layer, a second color conversion layer, and a third color conversion layer overlapping the first light emitting element, the second light emitting element, and the third light emitting element on the light emitting element substrate;
a light buffer layer on the second color conversion layer; and
a color filter on the light buffer layer,
wherein the light buffer layer is disposed between the second color conversion layer and the color filter.

18. The display device of claim 17, further comprising:
a protective layer between the light buffer layer and the first color conversion layer, the second color conversion layer, and the third color conversion layer.

19. The display device of claim 17, further comprising:
a protective layer covering the light buffer layer.

20. The display device of claim 17, further comprising:
a first protective layer between the light buffer layer and the first color conversion layer, the second color conversion layer, and the third color conversion layer; and
a second protective layer covering the light buffer layer.

* * * * *